United States Patent
Lee et al.

(10) Patent No.: US 8,329,546 B2
(45) Date of Patent: Dec. 11, 2012

(54) MODIFIED PROFILE GATE STRUCTURE FOR SEMICONDUCTOR DEVICE AND METHODS OF FORMING THEREOF

(75) Inventors: Da-Yuan Lee, Jhubei (TW); Kuang-Yuan Hsu, Fongyuan (TW); Matt Yeh, Hsinchun (TW); Yi-Chen Huang, Hsin Chu (TW); Fan-Yi Hsu, Toufen Town (TW); Hui Ouyang, Chubei (TW); Ming-Jie Huang, Hsinchu (TW); Shin Hsien Liao, Minsyong Township, Chiayi County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 144 days.

(21) Appl. No.: 12/872,642

(22) Filed: Aug. 31, 2010

(65) Prior Publication Data

US 2012/0049247 A1 Mar. 1, 2012

(51) Int. Cl.
*H01L 21/336* (2006.01)
*H01L 21/3213* (2006.01)
(52) U.S. Cl. .... 438/299; 438/585; 438/595; 257/E21.19
(58) Field of Classification Search .................. 438/299, 438/585, 595; 257/E21.19
See application file for complete search history.

(56) References Cited

U.S. PATENT DOCUMENTS

| | | | | |
|---|---|---|---|---|
| 4,849,376 A * | 7/1989 | Balzan et al. | | 438/582 |
| 5,405,787 A * | 4/1995 | Kurimoto | | 438/302 |
| 5,960,270 A * | 9/1999 | Misra et al. | | 438/197 |
| 6,077,733 A * | 6/2000 | Chen et al. | | 438/182 |
| 6,255,202 B1 * | 7/2001 | Lyons et al. | | 438/585 |
| 6,284,613 B1 * | 9/2001 | Subrahmanyam et al. | ... | 438/307 |
| 6,313,019 B1 * | 11/2001 | Subramanian et al. | | 438/585 |
| 6,535,351 B1 * | 3/2003 | Yip et al. | | 360/114.01 |
| 6,790,717 B2 * | 9/2004 | Behammer | | 438/182 |
| 7,365,015 B2 * | 4/2008 | Lin et al. | | 438/701 |
| 2005/0269644 A1 * | 12/2005 | Brask et al. | | 257/369 |
| 2009/0189201 A1 * | 7/2009 | Chang et al. | | 257/288 |
| 2011/0049640 A1 * | 3/2011 | Feustel et al. | | 257/369 |
| 2012/0052666 A1 * | 3/2012 | Choi | | 438/585 |

OTHER PUBLICATIONS

Chen-Cheng, Chen-Shien, Kai-Ming Ching and Chih-Hua Chen; "Through-Substrate Via for Semiconductor Device;" U.S. Appl. No. 11/844,650, filed Aug. 24, 2007; 20 Pages.

Xiong-Fei Yu, Wei-Yung Lee, Da-Yuan Lee, Kuang-Yuan Hsu, Yuan-Hung Chiu, Hun-Jan Tao, Hongyu Yu and Wu Ling; "Multiple Deposition, Multiple Treatment Dielectric Layer for a Semiconductor Device;" U.S. Appl. No. 12/761,159, filed Apr. 15, 2010; 36 Pages.

Da-Yuan Lee and Matt Yeh; "Precise Resistor on a Semiconductor Device;" U.S. Appl. No. 12/770,166, filed Apr. 29, 2010; 34 Pages.

* cited by examiner

*Primary Examiner* — Evan Pert
(74) *Attorney, Agent, or Firm* — Haynes and Boone, LLP

(57) ABSTRACT

A method of fabricating a semiconductor device is illustrated. A modified profile opening is formed on a substrate. The modified profile opening includes a first width proximate a surface of the substrate and a second width opposing the substrate. The second width is greater than the first width. A metal gate electrode is formed by filling the modified profile opening with a conductive material. A semiconductor device is also described, the device having a metal gate structure with a first width and a second, differing, width.

20 Claims, 25 Drawing Sheets

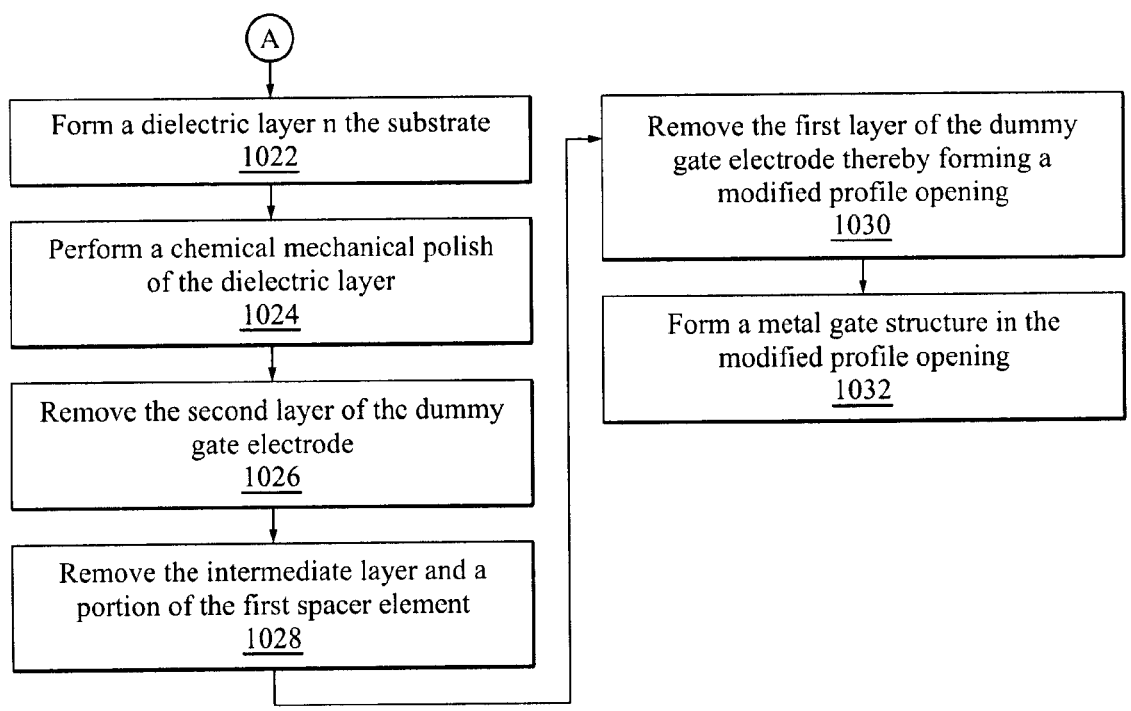
FIG. 10, continued

MODIFIED PROFILE GATE STRUCTURE FOR SEMICONDUCTOR DEVICE AND METHODS OF FORMING THEREOF

BACKGROUND

The present disclosure relates generally to a semiconductor device and, more particularly, to a semiconductor device having a metal gate and a process of forming such a device using a gate replacement process.

As technology nodes shrink, there has been a desire to replace the typically polysilicon gate electrode with a metal gate electrode to improve device performance with the decreased feature sizes. One process of forming a metal gate stack is termed a "gate last" process in which the final gate stack is fabricated "last," which allows for a reduced number of subsequent processes, including high temperature processing that must be performed after formation of the gate. Benefits of a gate last scheme include suppression of growth of an interfacial layer underlying the gate dielectric which allows for a beneficial equivalent oxide thickness (EOT), a reduction of gate leakage, and a proper work function of a metal gate.

There are challenges to implementing such features and processes in semiconductor fabrication however. A "gate last" process uses a replacement gate methodology, which includes forming a dummy gate structure that is subsequently removed. A metal gate is formed in the opening created by the dummy gate structure's removal. However, with shrinking dimensions and the resulting increasing aspect ratios, filling the opening with conductive material may cause processing difficulties such as, adequate step coverage, voids, and/or other issues.

SUMMARY

In one embodiment, a method of fabricating a semiconductor device is illustrated. A substrate is provided. A modified profile opening is formed on the substrate (e.g., in one or more layers on the substrate). The modified profile opening includes a first width proximate a surface of the substrate and a second width opposing the substrate. The second width is greater than the first width. A metal gate electrode is formed by filling the modified profile opening with a conductive material.

In another embodiment, a method is described which includes providing a substrate. A dummy gate structure is formed on the substrate. The dummy gate structure is subsequently removed from the substrate. In removing the substrate, a modified profile opening is formed on the substrate. The modified profile opening has a first width and a second width, the widths being different. A metal gate electrode is formed in the modified profile opening.

In yet another embodiment, a semiconductor device is provided. The device includes a semiconductor substrate having a first surface. A metal gate structure is disposed on the first surface of the substrate. The metal gate structure includes a first width and a second width. The second width is greater than the first width. The first width is proximate the first surface of the substrate.

DETAILED DESCRIPTION

Figure 1:
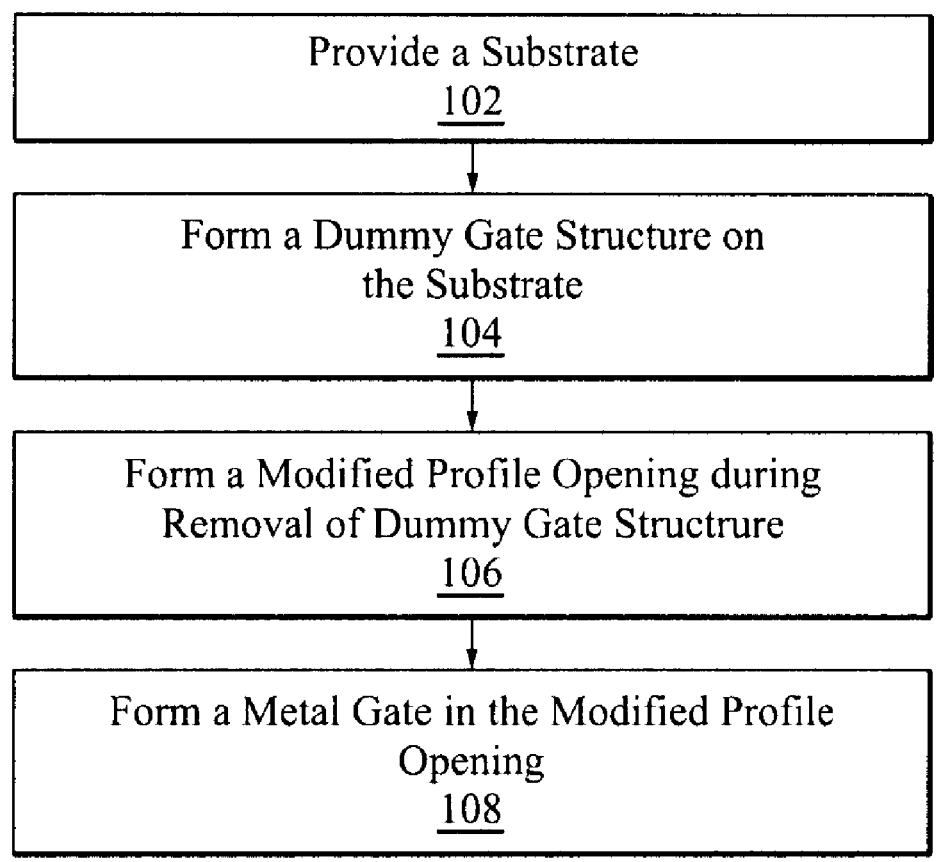
FIG. 1 is a flow chart of an embodiment of a method of forming a metal gate structure having a modified profile.

The present disclosure relates generally to forming a semiconductor device on a substrate and, more particularly, to a gate replacement process and a semiconductor device which include a modified profile metal gate structure. It is understood, however, that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature on a second feature in the description that follows may include embodiments in which the first and second features are formed in direct contact, and may also include embodiments in which additional features may be formed interposing the first and second features, such that the first and second features may not be in direct contact. As an example, a feature formed on a substrate may include features formed on, above, and/or within the substrate.

Referring to FIG. 1, illustrated is a flowchart of a method 100. The method 100 provides a method of forming a semiconductor device including a gate structure having a modified profile. The method 100 includes using a gate replacement process including providing a modified profile opening in which to form a gate structure. The gate structure may include a metal gate electrode.

The method 100 begins at block 102 where a substrate is provided. The substrate is typically a semiconductor substrate. In an embodiment, the substrate is a silicon substrate (e.g., wafer) in crystalline structure. The substrate may include various doping configurations depending on design requirements (e.g., p-type substrate or n-type substrate). Other examples of the substrate include other elementary semiconductors such as germanium and diamond; a compound semiconductor such as, silicon carbide, gallium arsenide, indium arsenide, or indium phosphide; and/or other possible compositions. The substrate may optionally include an epitaxial layer (epi layer), may be strained for performance enhancement, and/or may include a silicon-on-insulator (SOI) structure. Furthermore, the substrate may include one or more features formed thereon including, for example, isolation features, implanted regions, gate structures, interconnect structures, and/or a variety of other typical semiconductor device features or portions thereof.

The method 100 then continues to block 104 where a dummy gate electrode is formed on the substrate. The dummy gate electrode is a sacrificial structure that may include one or more layers. A typical dummy gate electrode includes polysilicon. Other examples of dummy gate electrode materials include amorphous silicon. The dummy gate electrode may be formed on or adjacent to an interface layer, a gate dielectric (including a sacrificial gate dielectric, a high-k gate dielectric, and/or other suitable layers), and/or other suitable layers. Additional layers, such as etch stop layers, may also be formed on the substrate.

Any plurality of processes may occur between the formation of the dummy gate electrode and block 106 of the method 100 including, but not limited, formation of a source and drain region (e.g., a low-dose source/drain region) on the substrate. These processes may include those typically provided in a CMOS process and as such, are not described in detail herein.

Figure 7:
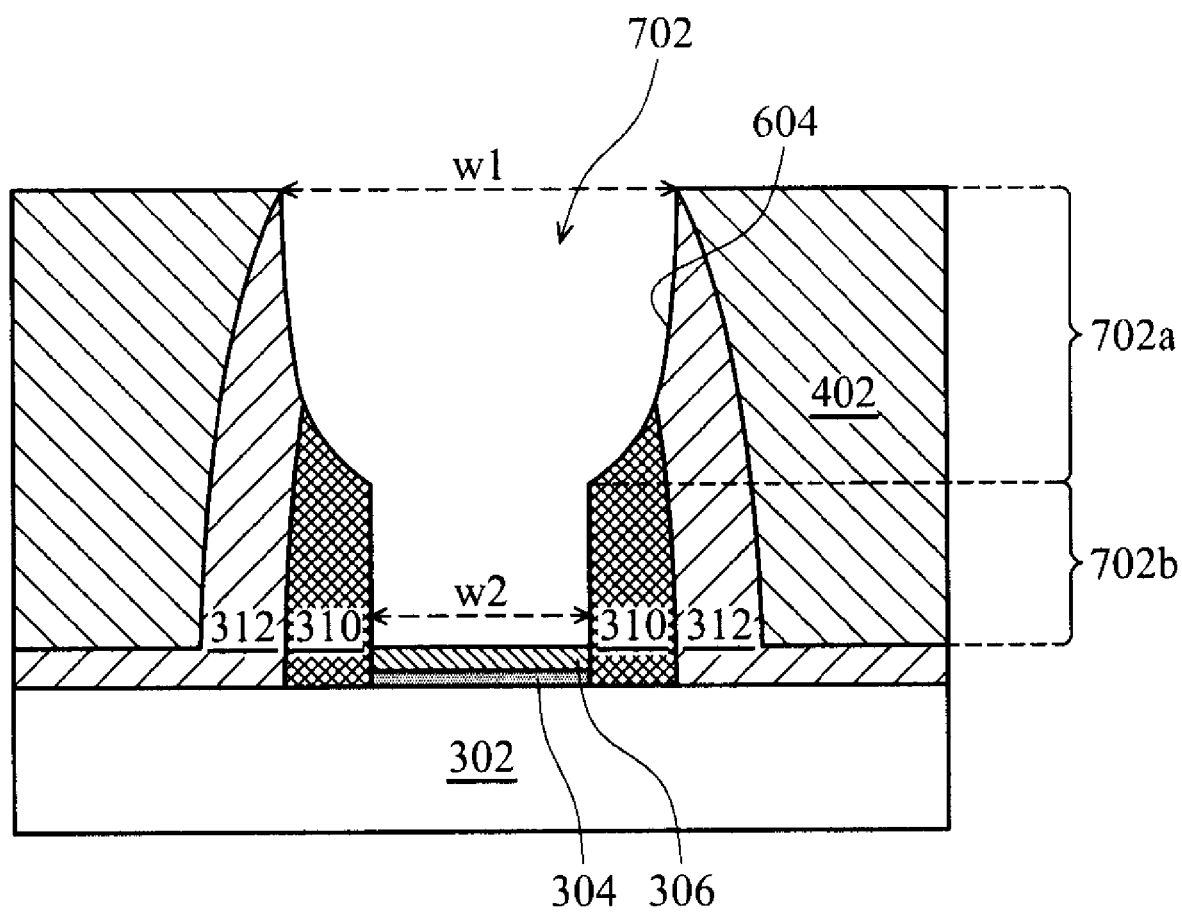
Figure 22:
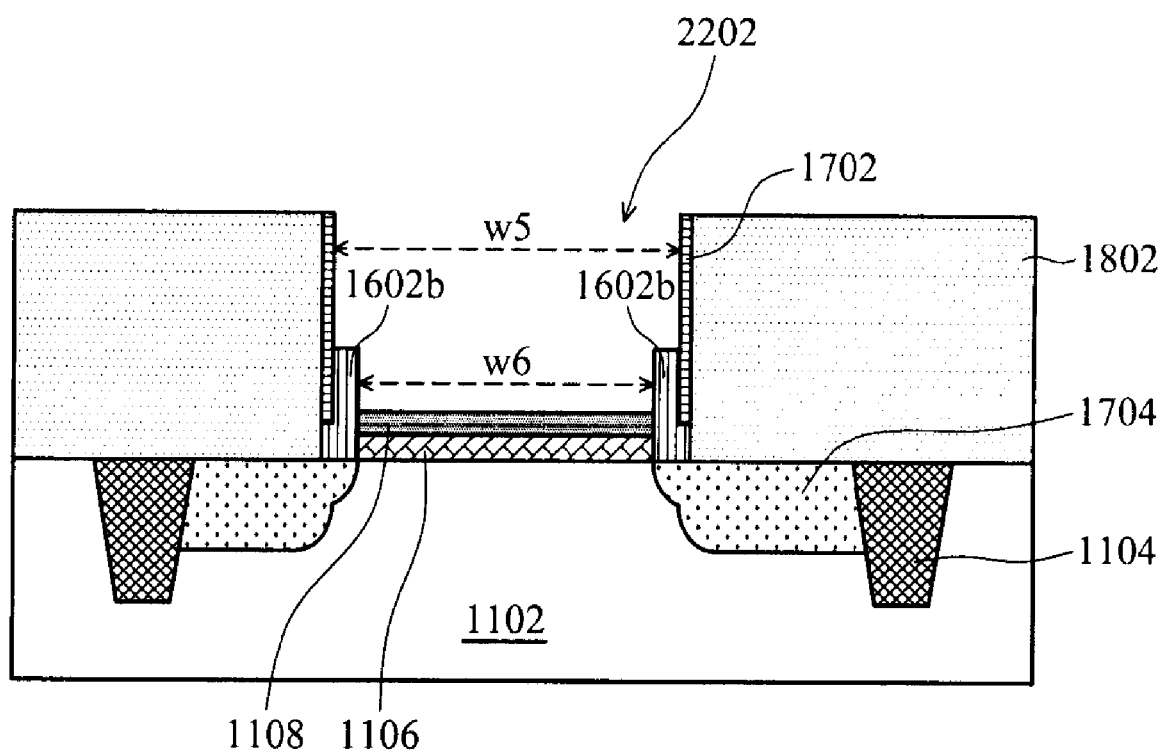

The method 100 then proceeds to block 106 where the dummy gate structure (e.g., including the dummy gate electrode and/or other sacrificial layers) is removed and a modified profile opening is formed. The modified profile opening may be formed in the steps before, after, or coincident with the removal of the dummy gate structure. The modified profile opening includes an opening formed on the substrate having a first width proximate a top surface of the substrate and a second width of the opening at a portion opposing the top surface of the substrate. The width may be defined as a distance between sidewalls of an opening. The second width is greater than the first width. Exemplary embodiments of the modified profile opening are described below with reference to FIGS. 7 and 22. The dummy gate structure may be removed using a wet etch and/or a dry etch. In an embodiment, a wet etch process includes exposure to a hydroxide containing solution (e.g., ammonium hydroxide), deionized water, and/or other suitable etchant solutions. An etch stop layer may provide an endpoint for the dummy gate structure removal. In an embodiment, removing the gate structure also includes removing a gate dielectric layer and/or interface layer from the substrate. Alternatively, a gate dielectric layer may remain on the substrate and function as the gate dielectric for a resulting device, while an overlying dummy gate electrode is removed.

Figure 24:
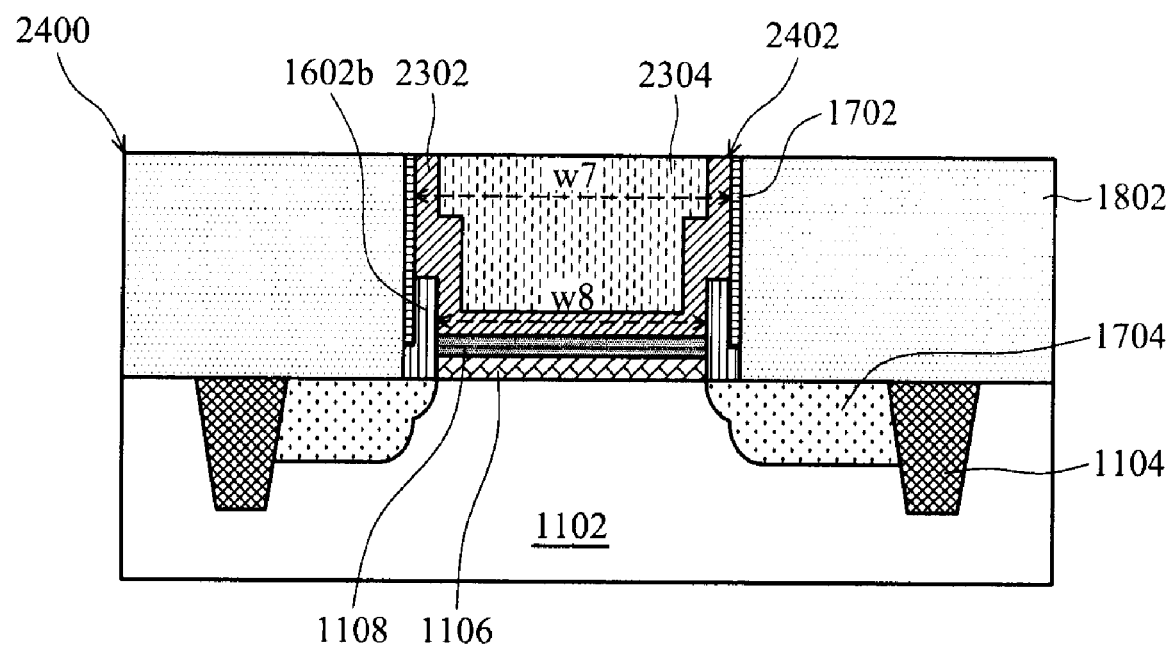

The method 100 then proceeds to block 108 where a metal gate structure is formed in the modified profile opening. The gate structure formed may include a gate dielectric, a liner, a gate electrode (including, for example, a work function portion and a conductive fill portion), a contact, and/or other features. The gate structure may include one or more layers including one or more layers of conductive (e.g., metal) material. The layers fill the modified profile opening such that the resulting gate structure has a modified profile. The gate structure has a first width at a portion proximate (e.g., adjacent) the substrate surface, and a second width at a portion opposing (e.g., opposite) the substrate surface. The second width is greater than the first width. Example gate structures having modified profiles are described, for example, in FIGS. 9 and 24.

Example compositions of the metal gate structure include Ti, TiN, TaN, Ta, TaC, TaSiN, W, WN, MoN, MoON, $RuO_2$, and/or other suitable materials. The metal gate structure may include one or more layers formed by physical vapor deposition (PVD), chemical vapor deposition (CVD), atomic layer deposition (ALD), plating, and/or other suitable processes. P-type metal materials and/or n-type metal materials may be used. P-type metal materials include compositions such as ruthenium, palladium, platinum, cobalt, nickel, and conductive metal oxides, and/or other suitable materials. N-type metal materials include compositions such as hafnium, zirconium, titanium, tantalum, aluminum, metal carbides (e.g., hafnium carbide, zirconium carbide, titanium carbide, aluminum carbide), aluminides, and/or other suitable materials.

Benefits to one or more embodiments of the method 100 may include a more effective metal gate structure. For example, due to the modified profile opening in which the metal gate is formed, the material (e.g., metal) is more likely to adequately fill the opening. The modified profile opening and/or the resulting modified profile gate structure may allow for a decreased the aspect ratio of the opening to be filled, an increased step-coverage, a decreased overhang produced by the metal fill, a reduction in voiding, an increased process window, a lower gate resistance, and/or various other benefits.

Figure 2:
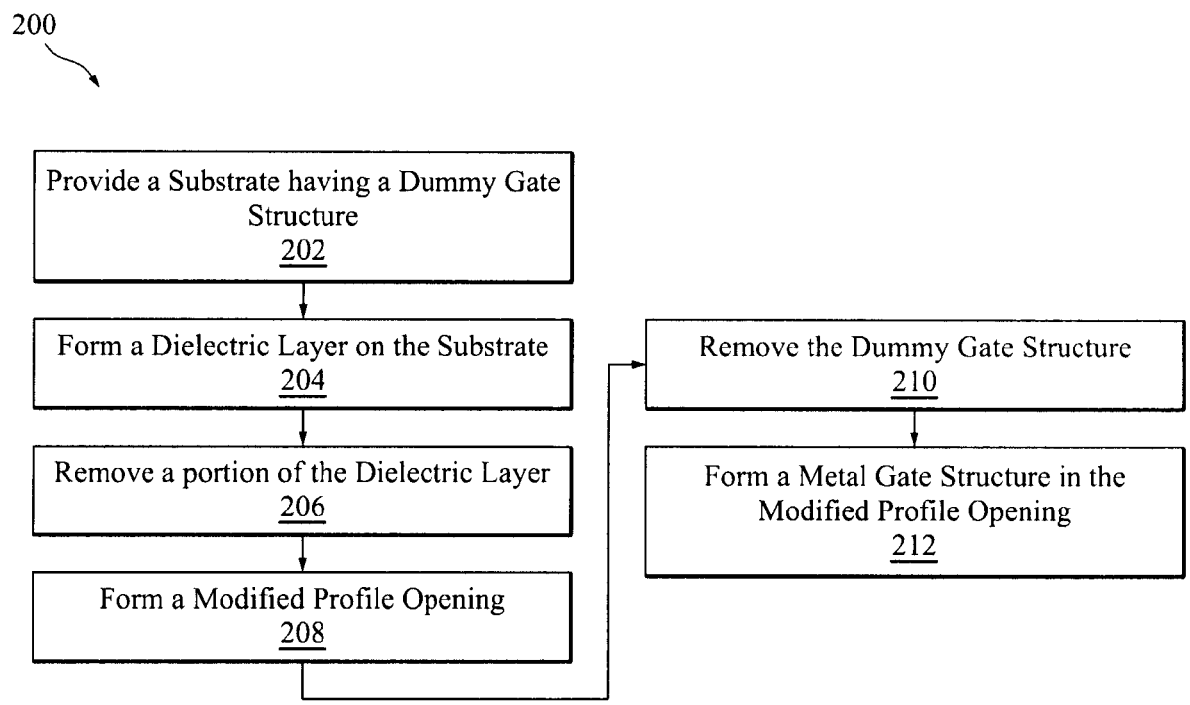
FIG. 2 is a flow chart illustrating an embodiment of the method of FIG. 1.
Figure 3:
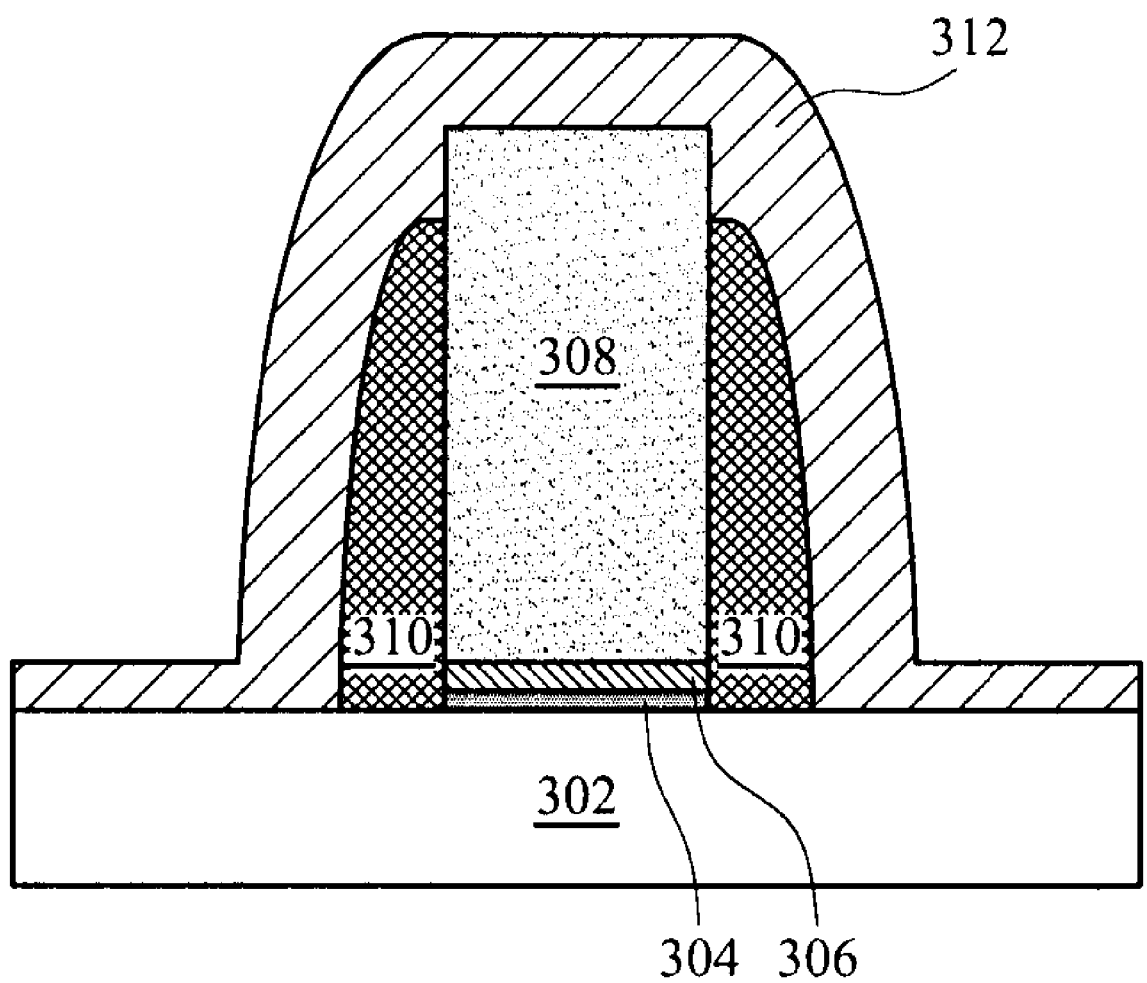
FIGS. 3, 4, 5, 6, 7, 8, and 9 are cross-sectional views of a semiconductor device corresponding to steps of the method of FIG. 2.

Referring now to FIG. 2, a method 200 is illustrated which describes an embodiment of the method 100, described above with reference to FIG. 1. The method 200 provides for forming a modified profile opening during a replacement gate process. The method 200 may be used to form a modified profile gate structure of a semiconductor device, FIGS. 3, 4, 5, 6, 7, 8 and 9 illustrate cross-sectional views of an embodiment of a semiconductor device at various stages of fabrication corresponding to the method 200 of FIG. 2.

The method 200 begins at block 202 where a substrate is provided. The substrate may be substantially similar to the substrate described above with reference to block 102 of the method 100. The substrate includes a dummy gate structure (e.g., sacrificial gate). The substrate may include additional features (e.g., layers). Referring to the example of FIG. 3, a substrate 302 is illustrated. In an embodiment, the substrate 302 is a silicon substrate (e.g., wafer) in crystalline structure. The substrate 302 includes an interfacial layer 304 formed thereon. In an embodiment, the interfacial layer 304 includes a silicon oxide ($SiO_2$) layer (e.g., thermal or chemical oxide formation). Other example compositions of the interfacial layer 304 include SiON, chemical oxide, HfSiO, ZrSiO, SiON, combinations thereof, or other suitable materials The interfacial layer 304 may be formed by atomic layer deposition (ALD), chemical vapor deposition (CVD), physical vapor deposition (PVD), thermal oxidation and nitridation, plasma oxidation and nitridation, or combinations thereof. The interfacial layer may have a thickness ranging from about 3 to about 20 Angstroms (A).

A gate dielectric layer 306 is disposed on the interfacial layer 304. The gate dielectric layer 306 may be a sacrificial layer (e.g., replaced at a later processing step) or a layer found in the resulting, functional device. The gate dielectric layer 306 may be silicon oxide, silicon nitride, silicon oxynitride, and/or other suitable materials. In an embodiment, the dielectric layer 306 is a high dielectric constant (high-k or HK) material. The high-k material may include metal oxides, metal nitrides, metal silicates, transition metal-oxides, transition metal-nitrides, transition metal-silicates, oxynitrides of metals, metal aluminates, zirconium silicate, zirconium aluminate, combinations thereof, or other suitable compositions. Example high-k dielectrics include hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), combinations thereof, and/or other suitable materials. Alternatively, the high-k dielectric layer may include other high-k dielectrics such as LaO, AlO, ZrO, TiO, $Ta_2O_5$, $Y_2O_3$, $SrTiO_3$ (STO), $BaTiO_3$ (BTO), BaZrO, HfLaO, HfSiO, LaSiO, AlSiO, $(Ba,Sr)TiO_3$ (BST), $Al_2O_3$, $Si_3N_4$, and/or other suitable materials. A dummy gate electrode 308 is disposed on the substrate. The dummy gate electrode 308 may be a sacrificial layer. In an embodiment, the dummy gate electrode 308 includes polysilicon. Other examples include amorphous silicon. Spacers 310 abut the sidewalls of the dummy gate structure (e.g., the dummy gate electrode 308). The spacers 310 may comprise silicon nitride, silicon oxide, silicon carbide, silicon oxynitride, combinations thereof, or other suitable materials. The spacers 310 may have a multi-layer structure. Typical formations methods include depositing a dielectric material and then anisotropically etching back the material. The spacers 310 may be used to form a source/drain region on the substrate 302. An etch stop layer 312 (e.g., contact etch stop layer (CESL)) is disposed on the substrate 302. In selecting the materials comprising the CESL 312, etching selectivity should be considered. Selectivity to the interlayer dielectric, described below with reference to block 204, may be considered. Examples of materials that may be used to form CESL 312 include silicon nitride, silicon oxide, silicon oxynitride, and/or other materials known in the art. The CESL 312 may be formed by plasma-enhanced chemical vapor deposition (PECVD) process and/or other deposition or oxidation processes known in the art. In an embodiment, the CESL 312 is between approximately 50 and 250 A in thickness, by way of example and not intended to be limiting. In an embodiment, the spacers 310 are between approximately 30 and 100 A in thickness, by way of example and not intended to be limiting.

Figure 4:
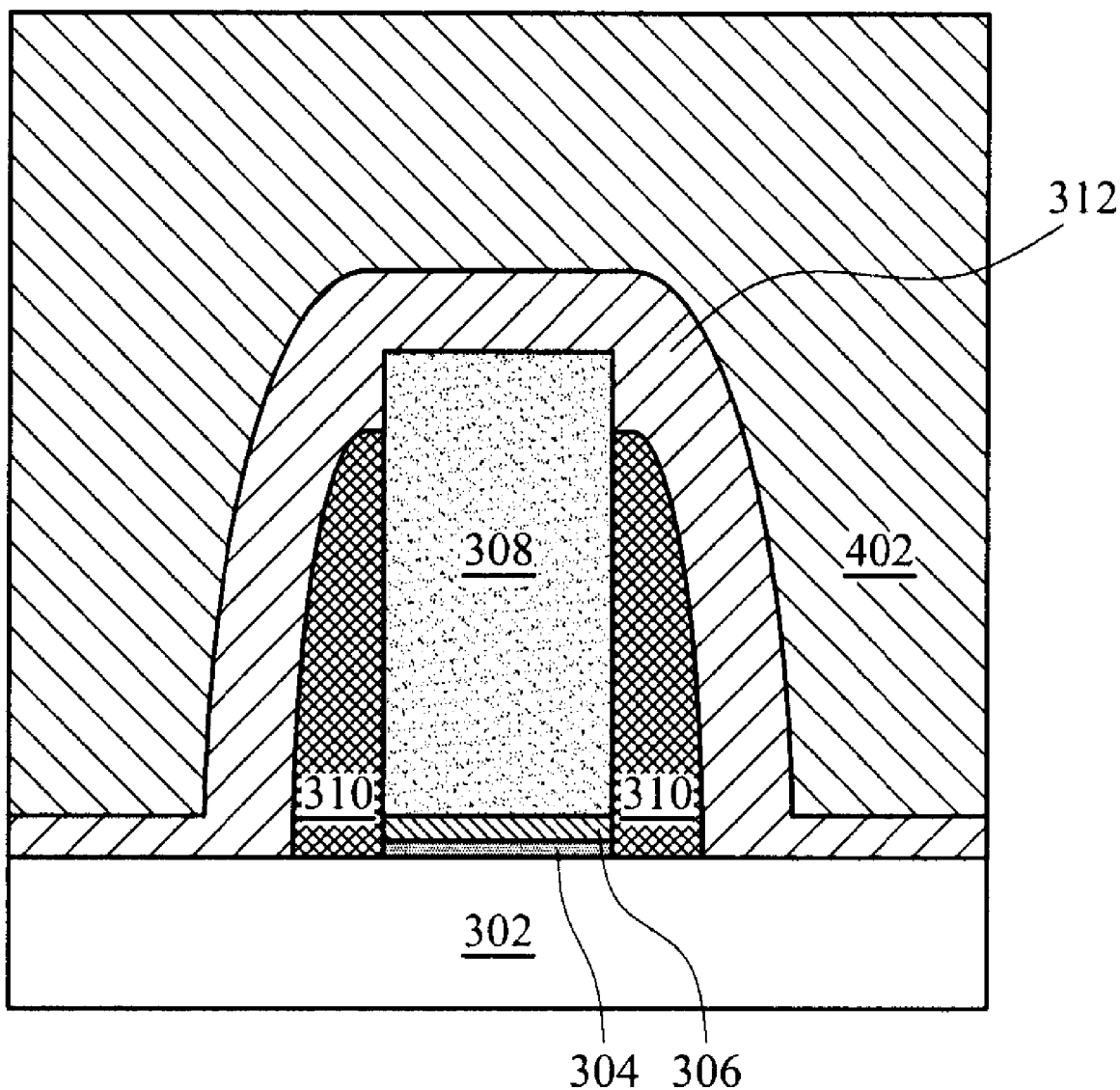
Figure 5:
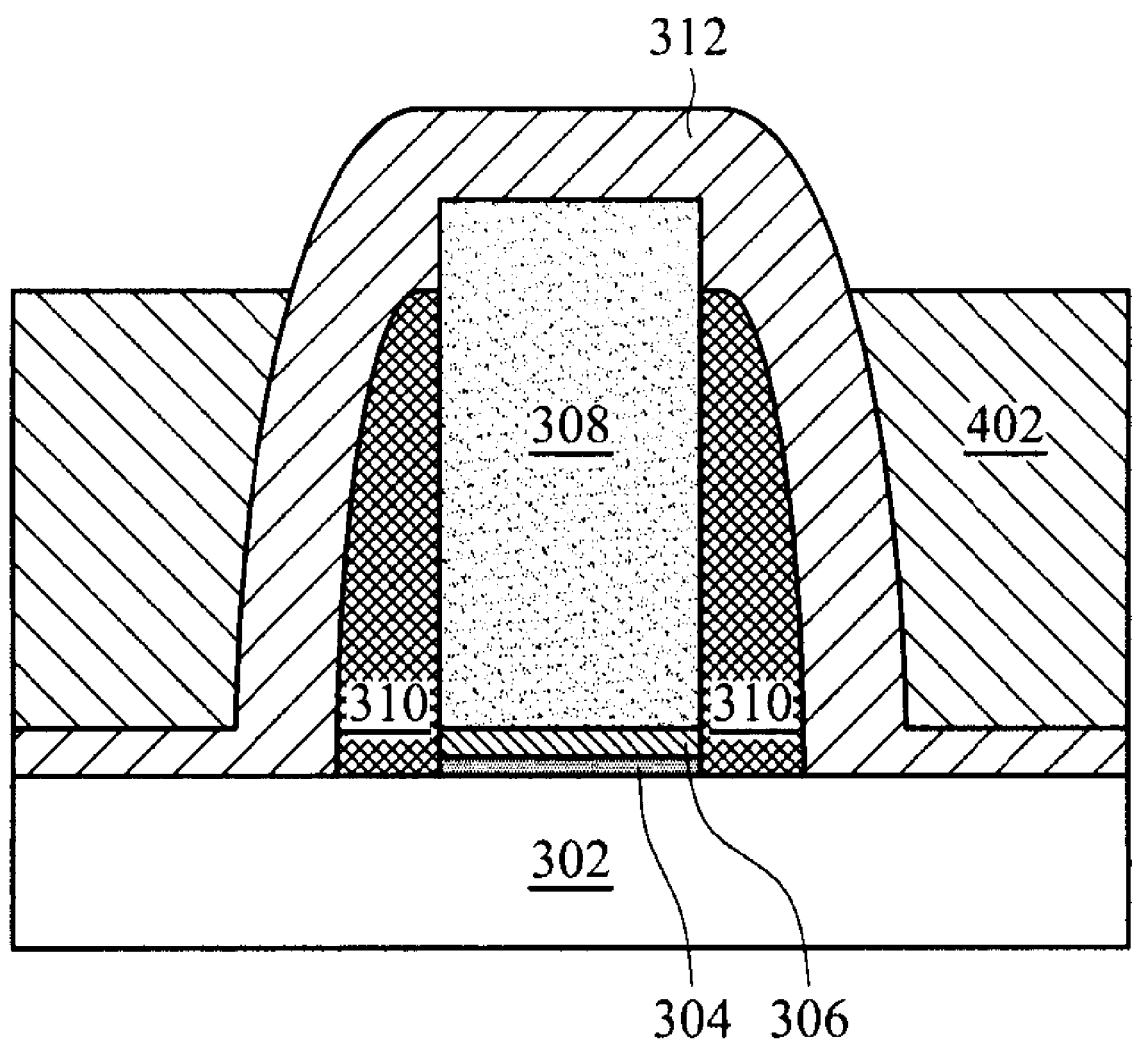
Figure 6:
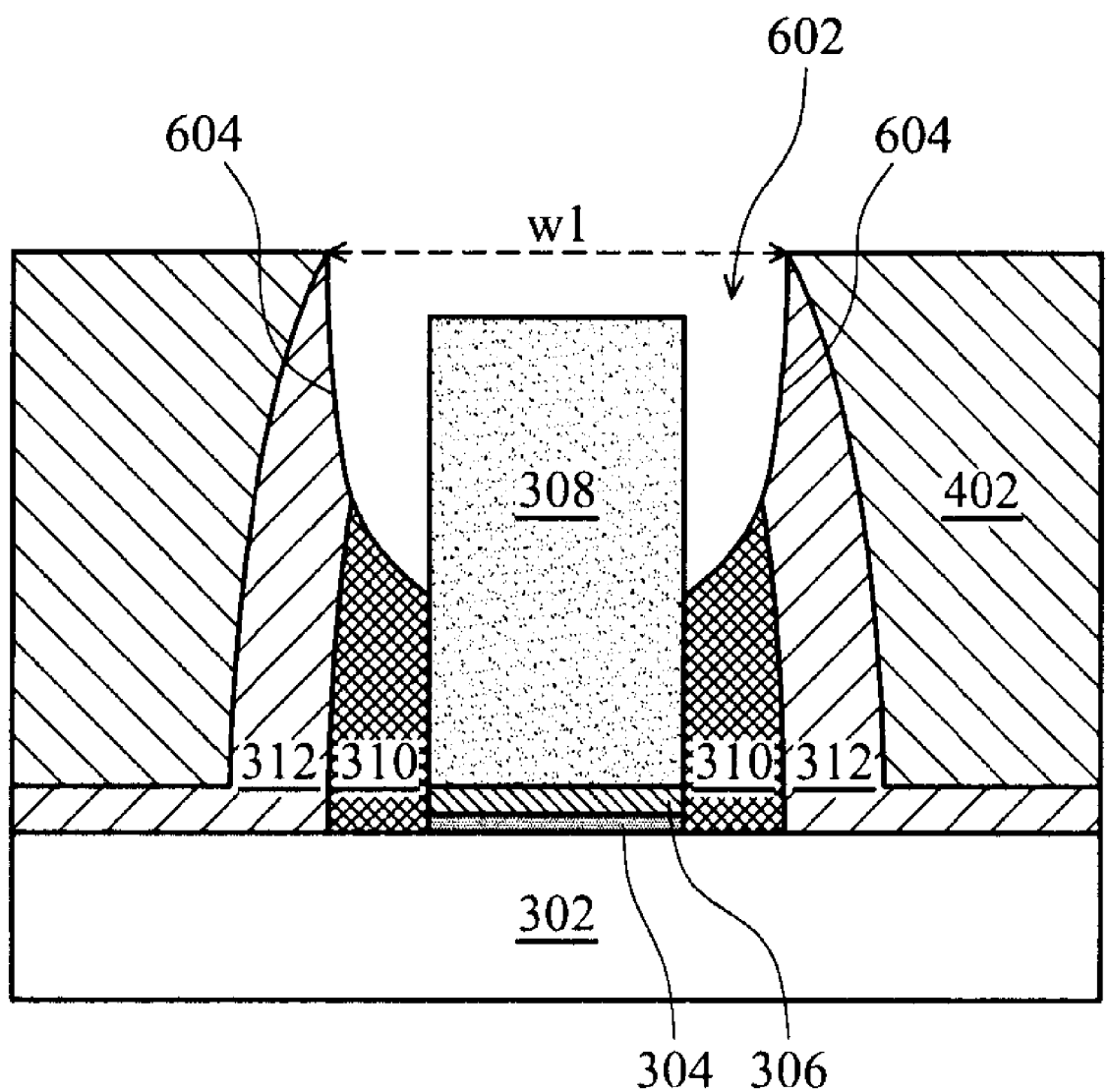

The method 200 proceeds to block 204 where a dielectric layer (e.g., interlayer dielectric (ILD) layer) is formed on the substrate. In the example of FIG. 4, an ILD layer 402 is formed on the substrate 302. The ILD layer 402 may be formed by chemical vapor deposition (CVD), high density plasma CVD, spin-on methods, sputtering, and/or other suitable methods. Example compositions of the ILD layer 402 include silicon oxide, silicon oxynitride, a low k material, and/or other suitable materials. In an embodiment, the ILD layer 402 is a high density plasma (HDP) dielectric.

The method 200 then proceeds to block 206 where a portion of the dielectric layer is removed. In an embodiment, a chemical mechanical polish (CMP) process is used to planarize and/or remove portions of the dielectric layer. Referring to the example of FIG. 5, the ILD layer 402 has been planarized such that the top of the dummy gate electrode 308 lies above the top surface of the ILD layer 402.

The method 200 then proceeds to block 208 where a modified profile opening is formed on the substrate. The modified profile opening may be formed by etching processes such as a wet etch or dry etch. In an embodiment, a wet etch is performed at elevated temperature (e.g., 100-180C) using H3PO4 with a concentration of 60-95% by weight. In another embodiment, a fluorine-based plasma etch is used. The fluorine-based plasma etch may provide for enhanced SiN/Oxide etch selectivity (e.g., greater than 4:1). The modified profile opening includes a first width at the surface of the dielectric layer opposing the substrate. The etching may be selective such that the dummy gate electrode is substantially not etched. In an embodiment, the etching is selective such that the dielectric layer (e.g., ILD) remains substantially not etched. The etching process may be referred to herein a "trimming" the spacers. The etch conditions may be appropriately selected such that the spacers formed abutting the dummy gate structure are selectively etched. Referring to the example of FIG. 6, a modified profile opening 602 is formed. The modified profile opening 602 has sidewalls 604 that are arcuate relative to the semiconductor substrate 302 surface. The modified profile opening includes a first width w1. Width w1 may be between greater than approximately 10 nanometers. The width w1 may be determined the by thickness of the spacers 301 and/or the CESL 312.

The method 200 then proceeds to block 210 where the dummy gate structure is removed from the substrate. Referring to the example of FIG. 7, the dummy gate electrode 308 (see FIG. 6) has been removed and opening 702 is provided, which is an expansion of the opening 602 (see FIG. 6). The selective removal of the dummy gate electrode 308 provides the opening 702 within which a metal gate may be formed.

The dummy gate electrode 308 may be removed using a wet etch and/or a dry etch. In an embodiment, a wet etch process includes exposure to a hydroxide containing solution (e.g., ammonium hydroxide), deionized water, and/or other suitable etchant solutions. In the present embodiment, the interfacial layer 304 and the gate dielectric layer 306 remain on the substrate 302. However, other embodiments, the gate dielectric layer 306 and/or the interfacial layer 304 may be removed from the substrate 302 (e.g., may be part of the dummy gate structure). In such embodiments, the interfacial layer and/or the gate dielectric layer may be formed in subsequent processes. The opening 702 includes a first portion 702a which includes arcuate sidewalls (sidewalls 604) and a second portion 702b which includes sidewalls that are substantially perpendicular to the top surface of the substrate 302. The opening 702 varies in width with the width w1 at an entrance to the opening opposite the surface of the substrate 302 and a width w2 adjacent the substrate 302. w1 is greater than w2. In an embodiment, w2 is greater than or equal to approximately 10 nm. In an embodiment, w1 is greater than or equal to approximately 15 nm.

Figure 8:
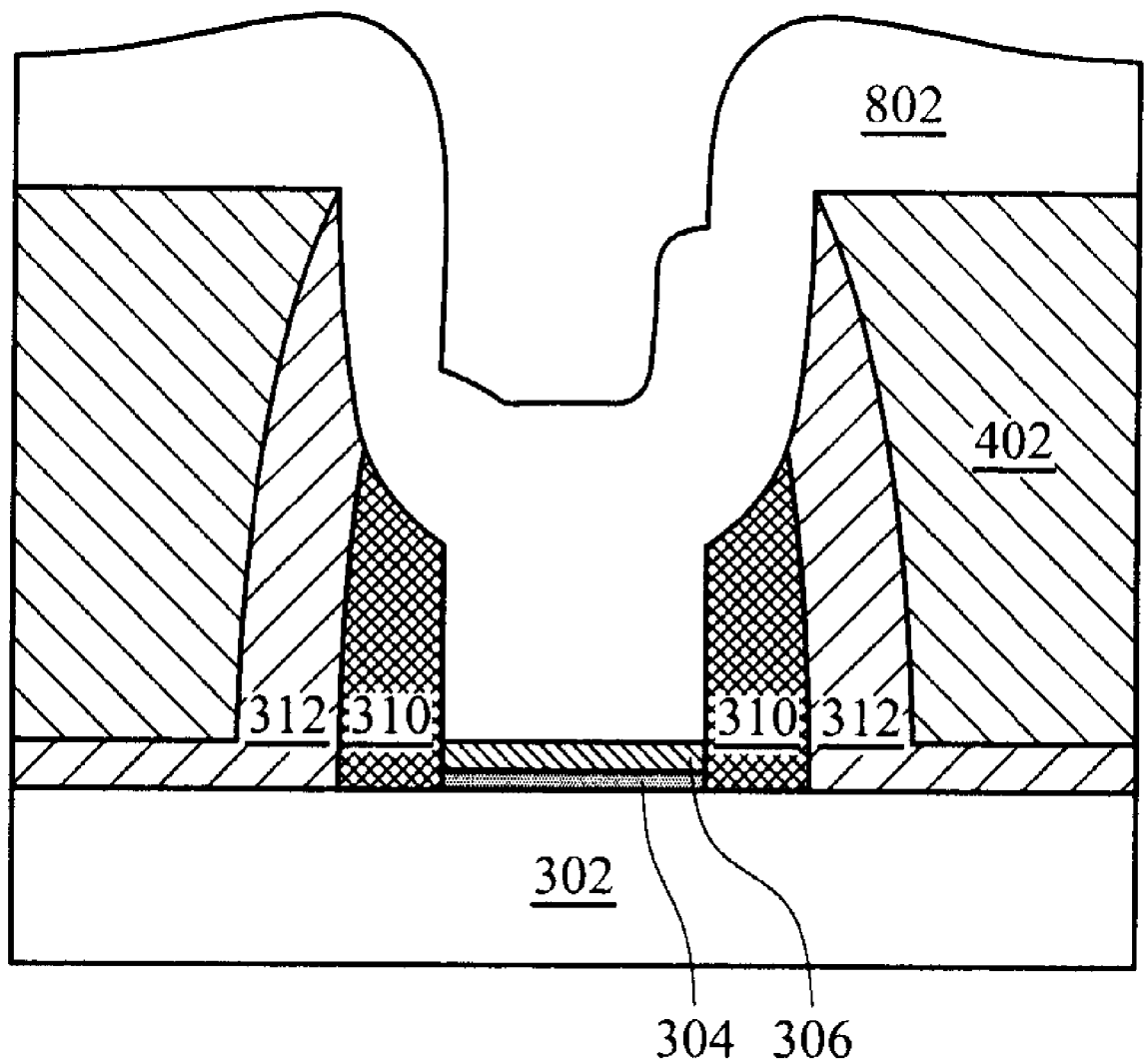
Figure 9:
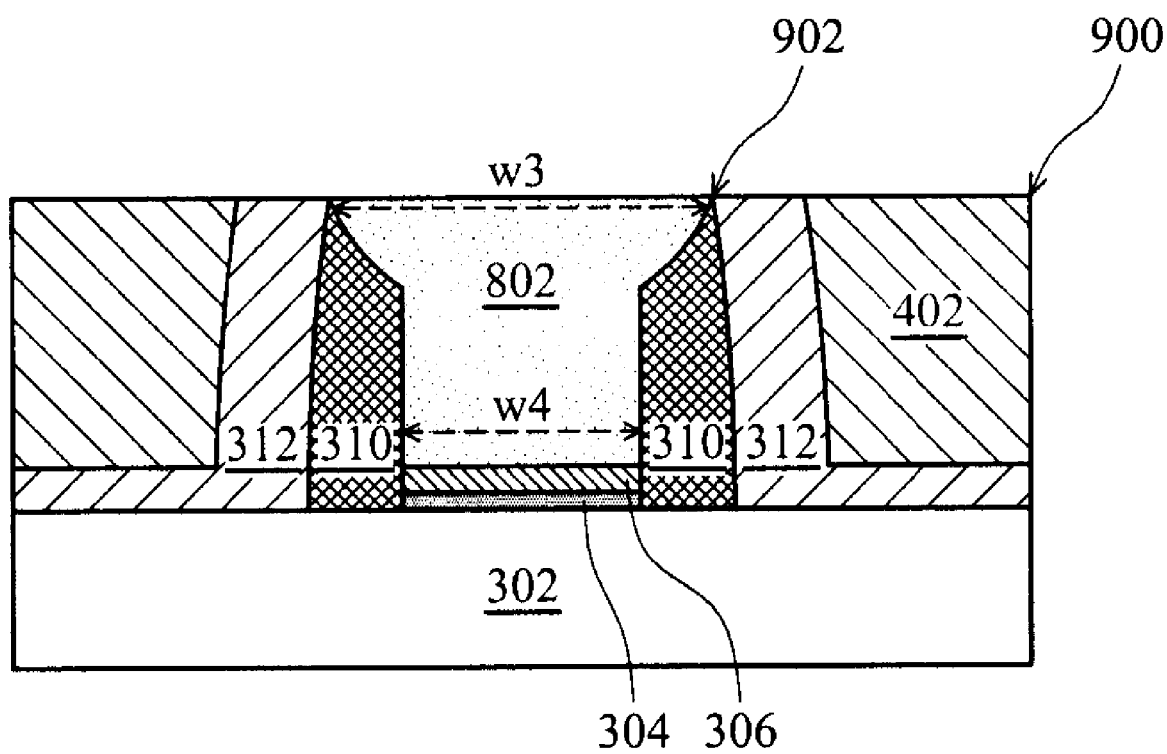

The method 200 then proceeds to block 212 where a metal gate structure is formed in the modified profile opening. The metal gate structure may include a modified profile such that the width of the gate structure is greater at at least one point of the structure. The metal gate structure may include liners, work function layers, fill layers, capping layers, and/or other suitable features of a metal gate structure. In an embodiment, the metal gate structure (e.g., electrode) has a greater width at a portion opposite the surface of the substrate. Referring to the example of FIG. 8, illustrated is a first layer of conductive material 802 formed in the opening 702. Following the deposition of one or more layers of material to form a metal gate structure, a CMP process may be performed. Referring to FIG. 9, illustrated is the device 900 formed after CMP process of the conductive material 802 and/or the ILD layer 402. The device 900 includes a metal gate structure 902. The metal gate materials may include one or more layers of material such as, liners, materials to provide appropriate work function of the gate, gate electrode materials, and/or other suitable materials. Example compositions of the metal gate structure 902, including conductive material 802, include Ti, TiN, TaN, Ta, TaC, TaSiN, W, WN, MoN, MoON, $RuO_2$, and/or other suitable materials. The metal gate structure 902 may include one or more layers formed by PVD, CVD, ALD, plating, and/or other suitable processes. P-type metal materials and/or n-type metal materials may be used. P-type metal materials include compositions such as ruthenium, palladium, platinum, cobalt, nickel, and conductive metal oxides, and/or other suitable materials. N-type metal materials include compositions such as hafnium, zirconium, titanium, tantalum, aluminum, metal carbides (e.g., hafnium carbide, zirconium carbide, titanium carbide, aluminum carbide), aluminides, and/or other suitable materials.

As illustrated in FIG. 9, the metal gate structure includes a first width w3 at a surface opposing the substrate 302 and a second width w4 at an end proximate the substrate 302. In an embodiment, w3 is greater than, or equal to, approximately 15 nanometers. In the embodiment, w1 may be greater than, or equal to, approximately 10 nanometers. w3 is greater than w4. In an embodiment, w3 is defined by the width of the spacers 310 (e.g., w3 extends from an interface with the CESL 312 to an opposing interface with the CESL 312). However, other embodiments may be possible. In an embodiment, w4 is greater than, or equal to, approximately 10 nanometers. In an embodiment, w3 is greater than, or equal to, approximately 12 nanometers.

The device 900 may be an intermediate device fabricated during processing of an integrated circuit, or portion thereof, that may comprise memory cells and/or other logic circuits, passive components such as resistors, capacitors, and inductors, and active components such as P-channel field effect transistors (PFET), N-channel FET (NFET), metal-oxide semiconductor field effect transistors (MOSFET), complementary metal-oxide semiconductor (CMOS) transistors, bipolar transistors, high voltage transistors, high frequency transistors, other memory cells, and combinations thereof.

Figure 10:
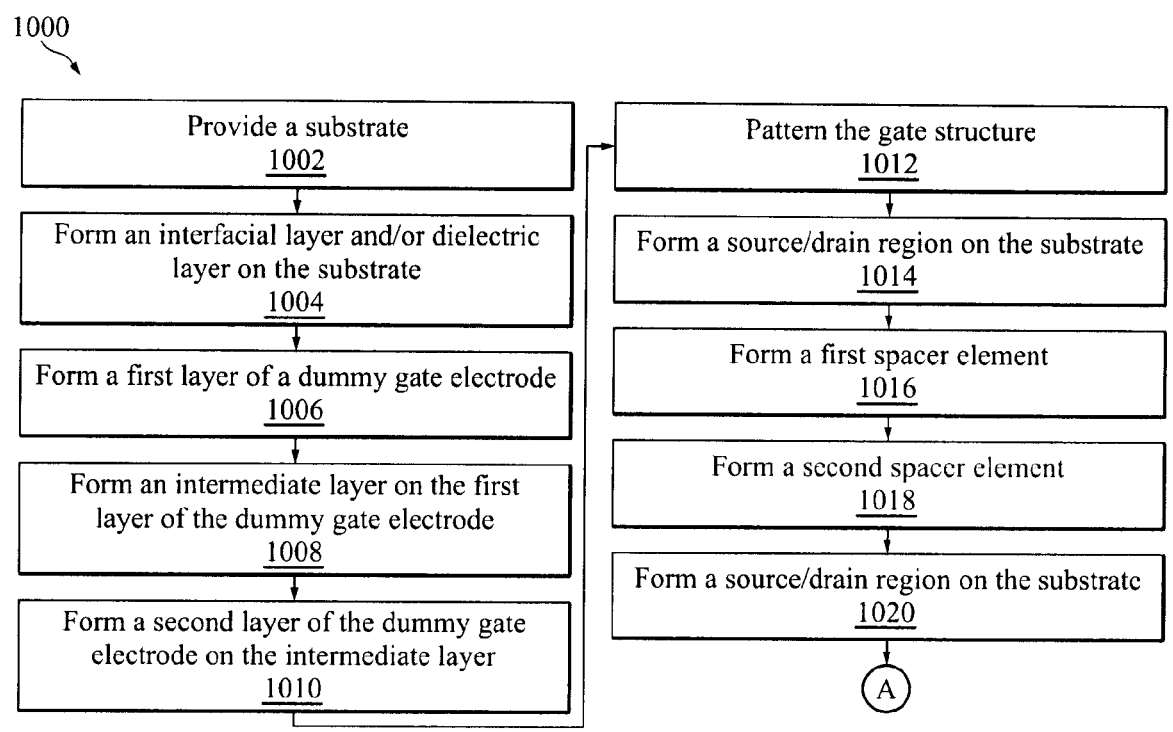
FIG. 10 is a flow chart of an alternative embodiment of the method of FIG. 1.
Figure 11:
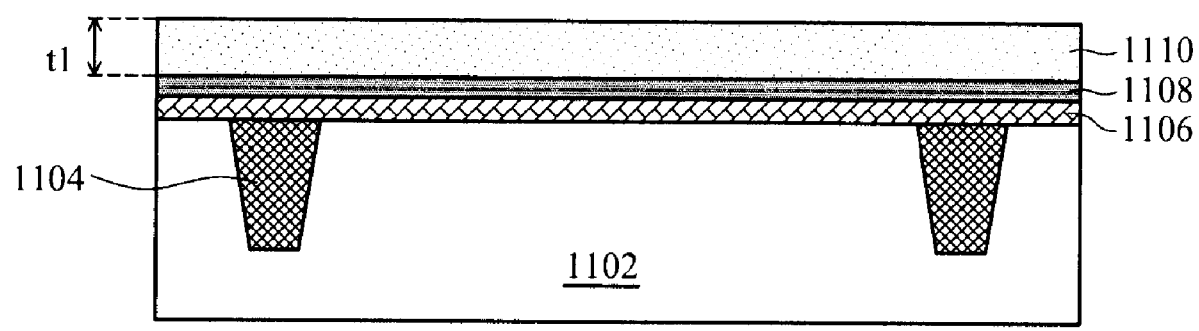
FIGS. 11, 12, 13, 14, 15, 16, 17, 18, 19, 20, 21, 22, 23, and 24 are cross-sectional views of a semiconductor device corresponding to steps of the method of FIG. 10.
Figure 12:
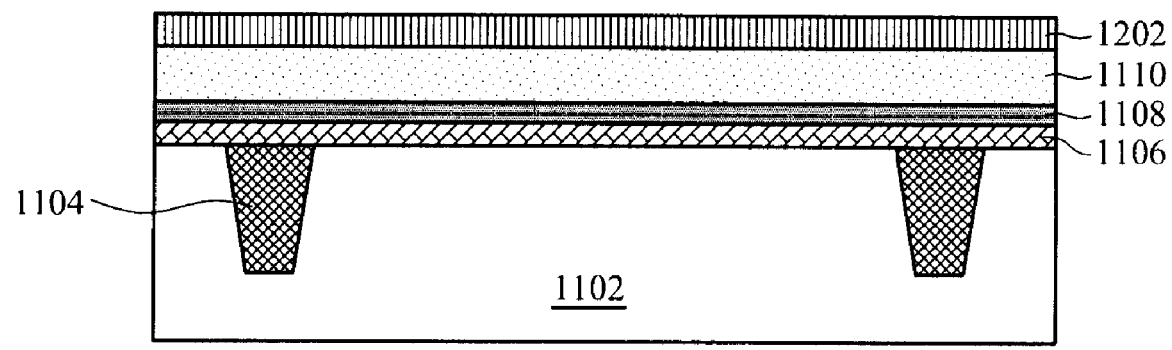
Figure 13:
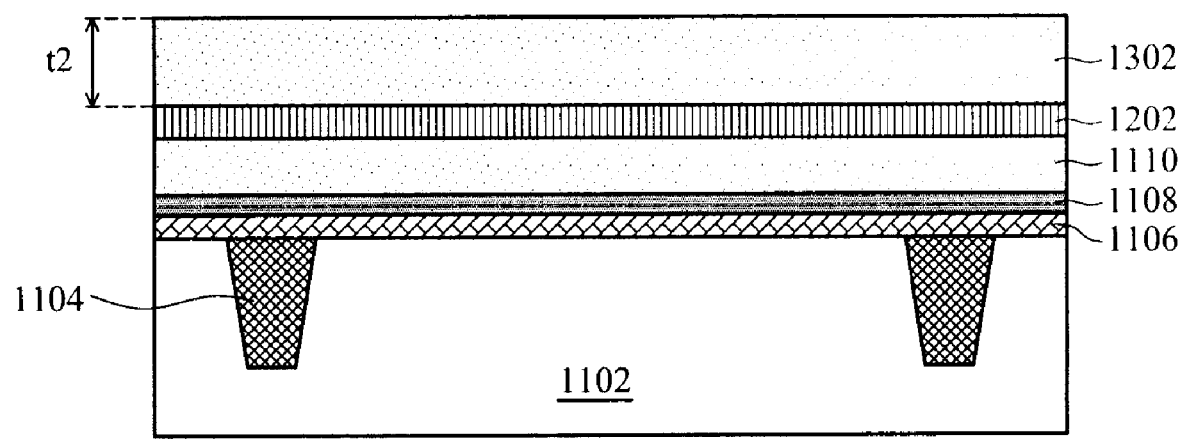
Figure 14:
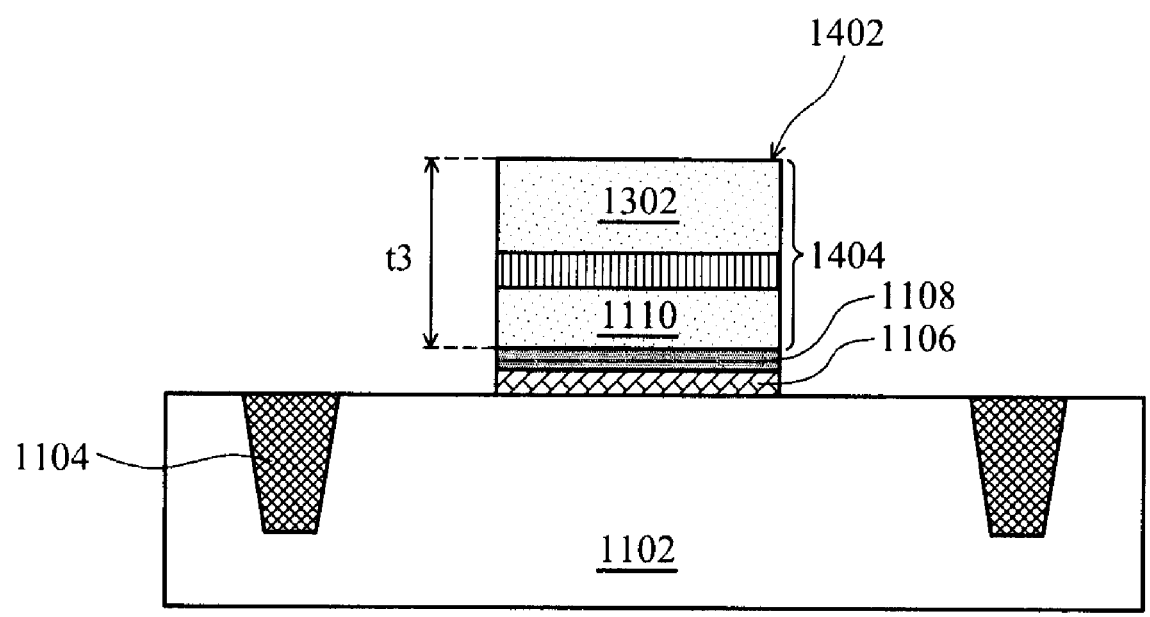
Figure 15:
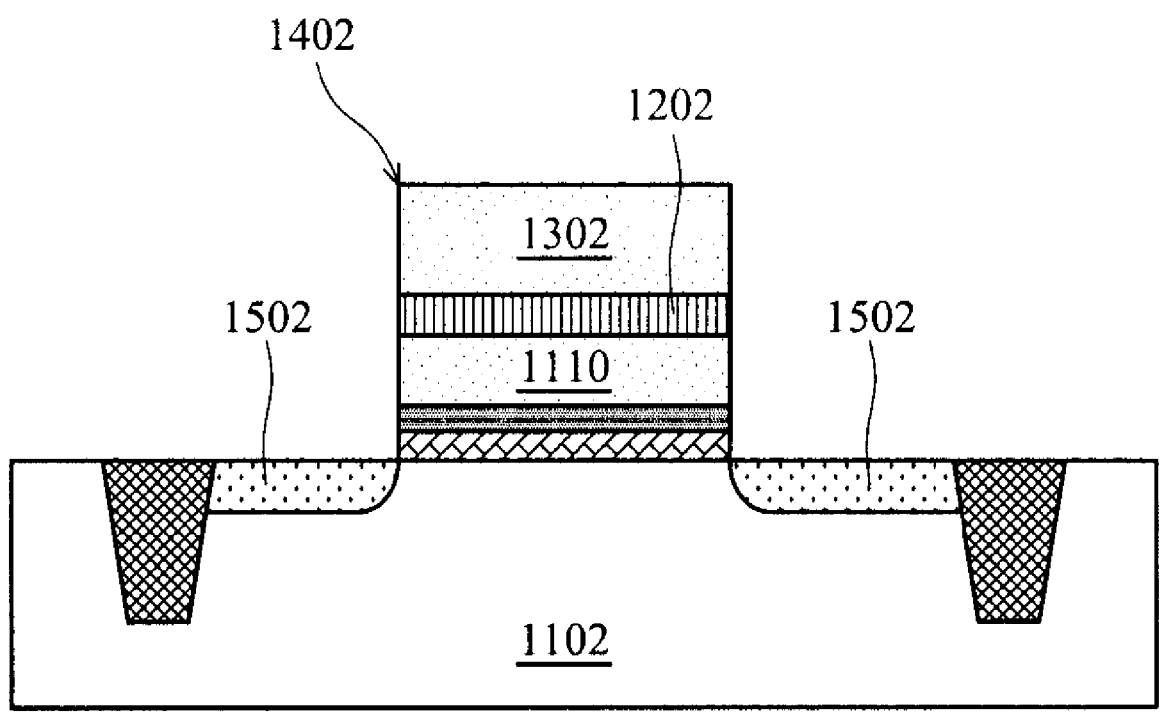
Figure 16:
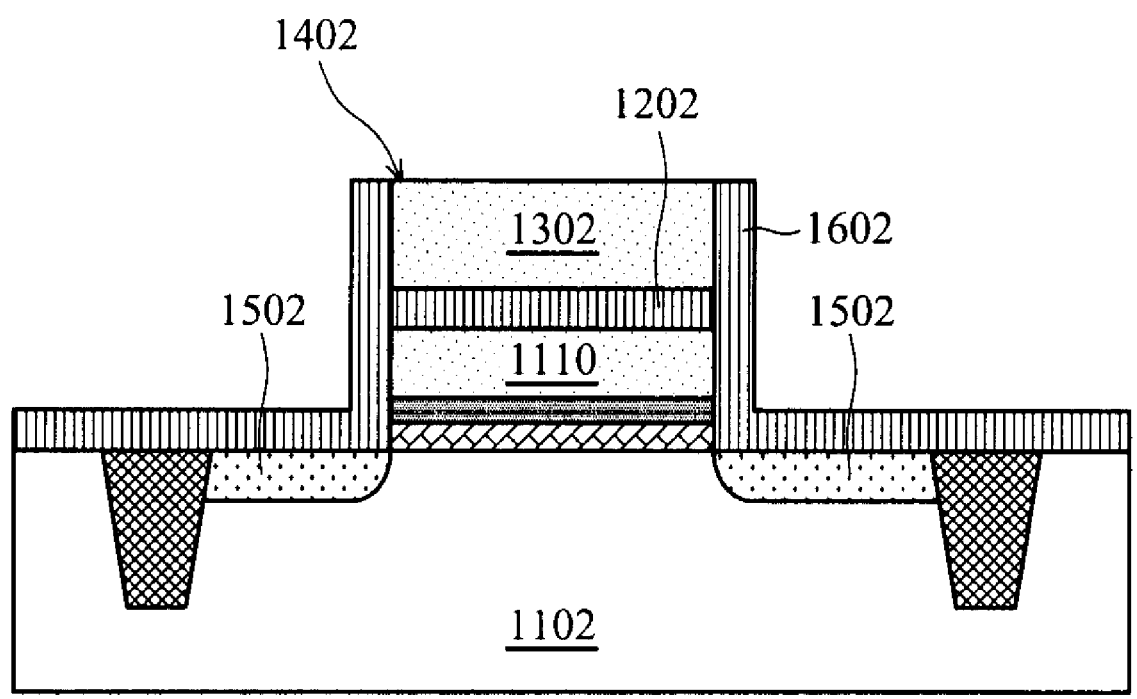

Referring now to FIG. 10, a method 1000 is illustrated which describes an embodiment of the method 100, described above with reference to FIG. 1. The method 1000 provides for forming a modified profile opening during a replacement gate process. The method 1000 may be used to form a modified profile gate structure of a semiconductor device. FIGS. 11-24 illustrate cross-sectional views of an embodiment of a semiconductor device at various stages of fabrication corresponding to the method 1000 of FIG. 10.

The method 1000 begins at block 1002 where a substrate is provided. Referring to the example of FIG. 11, a substrate 1102 is provided. The substrate 1102 may be substantially similar to the substrate 302, described above with reference to FIGS. 2 and 3. Isolation features 1104 are included on the substrate 1102. The isolation features 1104 may be shallow trench isolation (STI) features formed in the substrate 1102 and may isolate one or more devices from each other. The isolation features 1104 may include silicon oxide, silicon nitride, silicon oxynitride, fluoride-doped silicate glass (FSG), and/or a low-k dielectric material. Other isolation methods and/or features are possible in lieu of or in addition to STI features.

The method 1000 proceeds to block 1004 where an interfacial layer and/or dielectric layer are formed on the substrate. The dielectric layer may be a gate dielectric. The layers may be formed using blanket deposition and/or growth processes. Referring to the example of FIG. 11, an interfacial layer 1106 and a gate dielectric layer 1108 are formed on the substrate 1102. The interfacial layer 1106 and/or the gate dielectric layer 1108 may be sacrificial layers that are replaced in subsequent processing, or layers present in a final device. The interfacial layer 1106 may be substantially similar to the interfacial layer 304, described above with reference to FIGS. 2 and 3. The gate dielectric layer 1108 may be substantially similar to the gate dielectric layer 306, described above with reference to FIGS. 2 and 3.

The method 1000 then proceeds to block 1006 where a first layer of a dummy gate electrode is formed on substrate. The layer may be formed using a blanket deposition process. Referring to the example of FIG. 11, a first layer 1110 is formed on the substrate 1102 overlying the interfacial layer 1106 and the gate dielectric layer 1108. The first layer 1110 includes a thickness t1. The thickness t1 may be approximately 2000 angstroms or less. Example compositions for the first layer 1110 include polysilicon, amorphous silicon, and/or other suitable materials.

The method 1000 then proceeds to block 1008 where an intermediate layer is deposited on the first layer of the dummy gate electrode. The layer may be formed by a blanket deposition process. The intermediate layer may include material that is the same as or substantially similar to those materials typical used in the formation of spacer elements. Example compositions for the intermediate layer include silicon oxide, silicon nitride, silicon oxynitride, fluoride-doped silicate glass (FSG), a low k dielectric material, combinations thereof, and/or other suitable material. The intermediate layer may be less than approximately 100 Angstroms in thickness.

For example, in an embodiment, the intermediate layer is less than approximately 40 Angstroms. In a further embodiment, the intermediate layer is between approximately 10 and 20 Angstroms in thickness. Referring to the example of FIG. 12, an intermediate layer 1202 is formed on the substrate 1102.

The method 1000 then proceeds to block 1010 where a second layer of the dummy gate electrode is formed. The layer may be formed using a blanket deposition process. Referring to the example of FIG. 13, a second layer 1302 is formed on the substrate 1102 overlying intermediate layer 1202. The second layer 1302 includes a thickness t2. The thickness t2 may be approximately 2000 angstroms or less. Example compositions for the second layer 1302 include polysilicon, amorphous silicon, and/or other suitable materials. In an embodiment, the second layer 1302 has the same composition as the first layer 1110.

The method 1000 then proceeds to block 1012 where the dummy gate structure is patterned. The dummy gate structure may include the dummy gate electrode (e.g., first and second layers), the intermediate layer, the gate dielectric, and/or the interfacial layer. One or more of the layers may be sacrificial layers. In other embodiments, one or more of the layers, for example, the gate dielectric layer and the interfacial layer, may be retained in the produced semiconductor device. The patterning may be performed using semiconductor photolithography processes. Semiconductor photolithography typically includes the process steps of applying a layer of photoresist on a surface and exposing the photoresist to a pattern. A post-exposure bake (PEB) is often performed to allow the exposed photoresist polymers to cleave. The substrate including the cleaved polymer photoresist is then transferred to a developing chamber to remove the exposed photoresist, which is soluble to an aqueous developer solution. Typically, a developer solution such as tetra-methyl ammonium hydroxide (TMAH) is applied to the resist surface in the form of a puddle to develop the exposed photoresist. A de-ionized (DI) water rinse is then applied to the substrate to remove the dissolved polymers of the photoresist. The substrate is then sent to a spin dry process. Referring to the example of FIG. 14, the layers described above with reference to FIGS. 11, 12, and 13 have been patterned to form a gate structure (e.g., stack) 1402. The gate structure 1402 includes a dummy gate electrode 1404 having the first layer 1108, the intermediate layer 1202 and the second layer 1302. The thickness for the dummy gate electrode 1404 may be less than approximately 3000 Angstroms.

The method 1000 then proceeds to block 1014 where a source and drain region are formed on the substrate. The source and drain region may include a low-dose source/drain region (e.g., LDD). The source/drain regions may be formed using ion implantation, diffusion, and/or other suitable processes to introduce n-type and/or p-type dopants into the substrate. Referring to the example of FIG. 15, source and drain regions 1502 are formed on the substrate 1102.

The method 1000 then proceeds to block 1016 where a first spacer element is formed on the substrate. Example compositions for the first spacer element include silicon oxide, silicon nitride, silicon oxynitride, fluoride-doped silicate glass (FSG), a low k dielectric material, combinations thereof, and/or other suitable material. The spacers may be formed by methods including deposition of suitable dielectric material. The spacer material may be deposited by physical vapor deposition (PVD) (sputtering), chemical vapor deposition (CVD), plasma-enhanced chemical vapor deposition (PECVD), atmospheric pressure chemical vapor deposition (APCVD), low-pressure CVD (LPCVD), high density plasma CVD (HDPCVD), atomic layer CVD (ALCVD), and/ or other processes known in the art. In an embodiment, the deposited material is anisotropically etched. In an embodiment, the deposited material for the first spacer elements is etched after the formation of second spacer elements, described below with reference to FIG. 17.

In an embodiment, the first spacer element and the intermediate layer, described above with reference to block 1008, include the same or substantially similar composition. The first spacer element may be between approximately 5 and 30 angstroms in thickness. Referring to the example of FIG. 16, the spacer elements 1602 are formed. The spacer elements 1602 are formed abutting the sidewalls of the dummy gate structure 1402. As described above, in an embodiment, the spacer elements 1602 include the same composition as the intermediate layer 1202.

Figure 17:
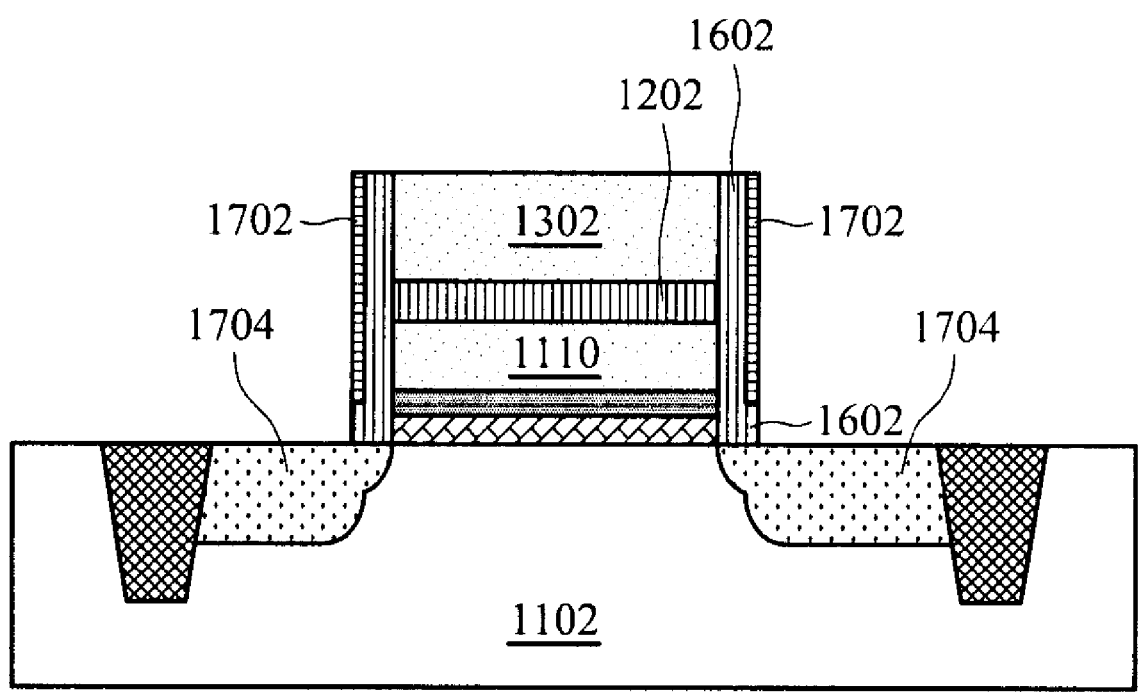
Figure 18:
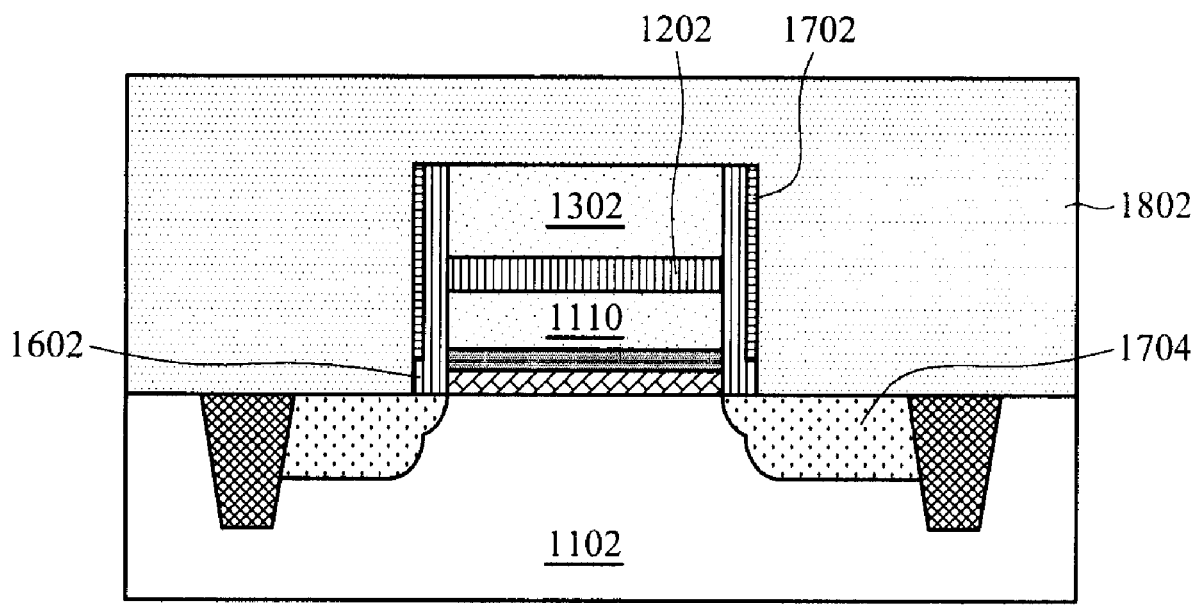
Figure 19:
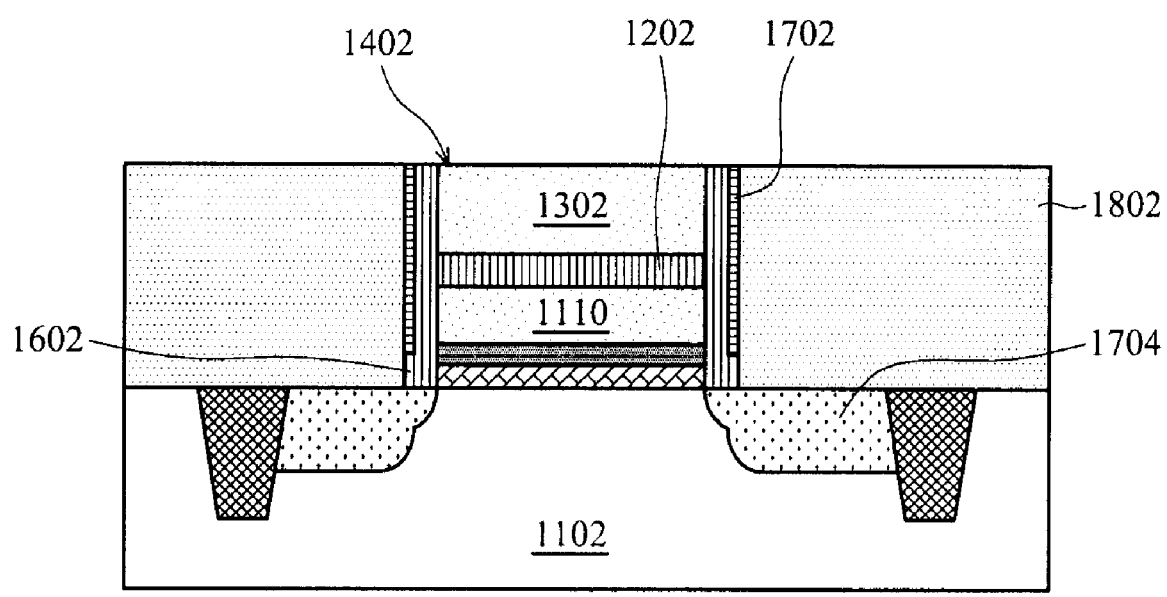
Figure 20:
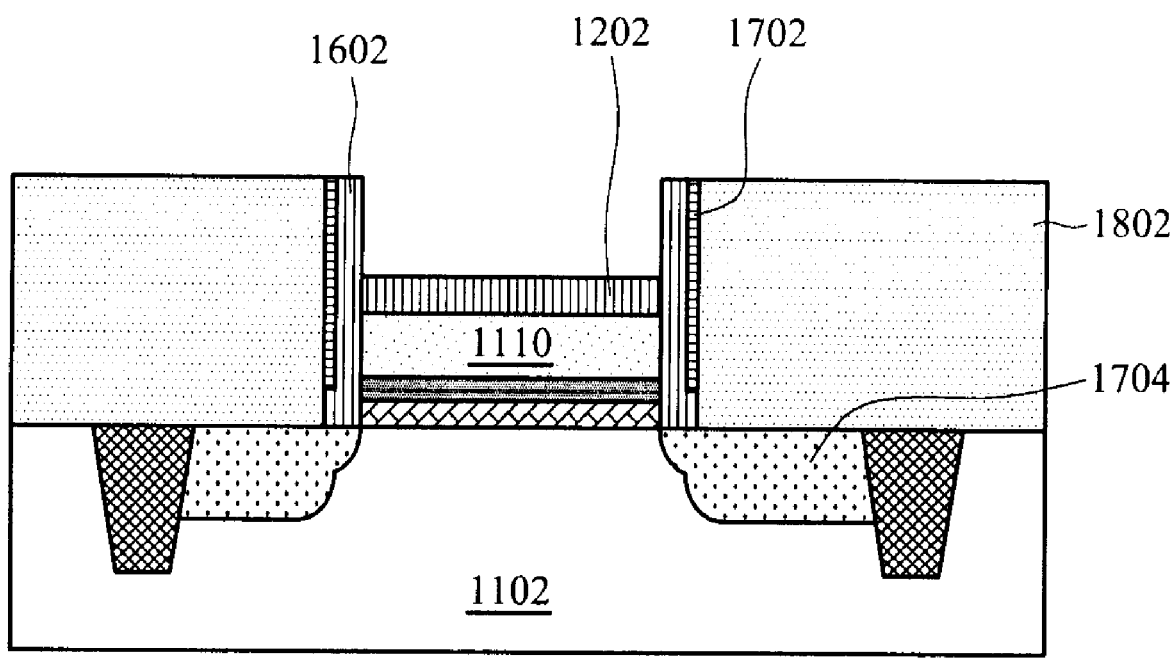
Figure 21:
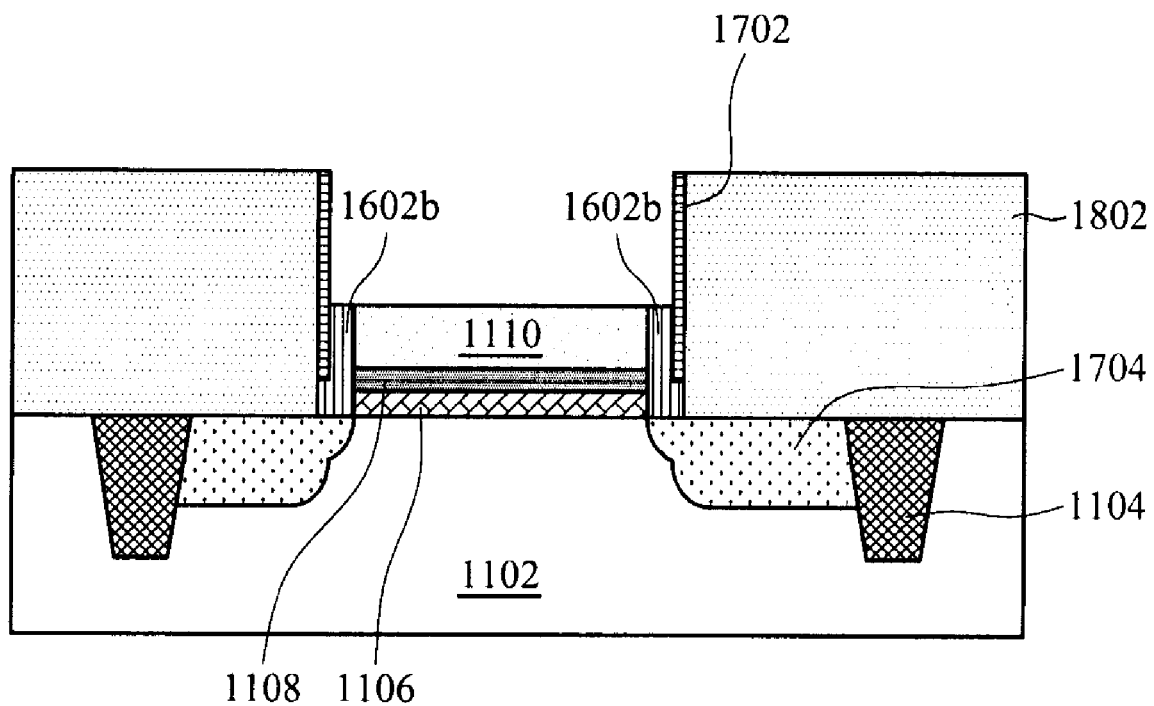

The method 1000 then proceeds to block 1018 where a second spacer element is formed. The second spacer element is formed abutting the sidewalls of the first spacer elements. Example compositions for the second spacer elements include silicon oxide, silicon nitride, silicon oxynitride, silicon carbide, fluoride-doped silicate glass (FSG), silicon carbide nitride (SiCN), a low k dielectric material, combinations thereof, and/or other suitable material. The second spacer elements may differ in composition from the first spacer element such that an etch selectivity between the elements may be provided. In an embodiment, the second spacer element has a lower wet etch rate in comparison with the first spacer elements. The second spacer element may be formed by deposition of suitable material, followed by an anisotropic etching process. In an embodiment, between approximately 10 and 300 Angstroms of material are deposited in forming the second spacer elements. Referring to the example of FIG. 17, second spacer elements 1702 are formed adjacent the first spacer elements 1602. As illustrated by FIG. 17, a portion of the material of the first spacer element 1602 deposited on the substrate 1102 maybe removed (e.g., etched) following the formation of the second spacer elements 1702.

The method 1000 then proceeds to block 1020 where source/drain regions are formed on the substrate. In an embodiment, block 1020 may precede block 1018. The source/drain regions may be formed using ion implantation, diffusion, and/or other suitable processes to introduce n-type and/or p-type dopants into the substrate. Referring to the example of FIG. 17, the source/drain regions 1704 are formed.

The method 1000 then proceeds to block 1022 where a dielectric layer is formed on the substrate. The dielectric layer may be an interlayer dielectric layer (ILD). The ILD layer may include dielectric materials such as, tetraethylorthosilicate (TEOS) oxide, un-doped silicon glass, or doped silicon oxide such as borophosphosilicate glass (BPSG), fused silica glass (FSG), phosphosilicate glass (PSG), boron doped silicon glass (BSG), and/or other suitable materials. The ILD layer may be deposited by a PECVD process or other suitable deposition techniques. Referring to the example of FIG. 18, an ILD layer 1802 is formed on the substrate 1102.

The method 1000 then proceeds to block 1024 where a chemical mechanical polish (CMP) process is performed. The CMP process may remove portions of the dielectric layer such that the gate structure (e.g., dummy gate electrode) is exposed. Referring to the example of FIG. 19, the ILD layer 1802 has been planarized to expose a top surface of the gate structure 1402. In particular, the second layer 1302 of the dummy gate electrode is exposed.

The method 1000 then proceeds to block 1026 where the second layer of the dummy gate electrode is removed. The layer may be removed using a wet etch and/or a dry etch. In an embodiment, a wet etch process includes exposure to a hydroxide containing solution (e.g., ammonium hydroxide), deionized water, and/or other suitable etchant solutions. In an embodiment, due to the etch selectivity between the second layer of the dummy gate electrode and the first spacer element, the first spacer element and the intermediate layer are not substantially etched. Referring to the example of FIG. 20, the second layer 1302 of the dummy gate electrode has been removed from the substrate 1102.

The method 1000 then proceeds to block 1028 where the intermediate layer and portions of the first spacer elements are removed. The layer(s) may be removed using wet etch and/or a dry etch. In an embodiment, a wet etch process includes phosphoric acid ($H_3PO_4$), diluted Hydrofluoric acid (DHF), DHF and ethylene glycol mixture, DHF and hydrochloric acid (HCl) mixture, and/or DHF and sulfuric acid ($H_2SO_4$) mixture, and/or combinations thereof. Referring to the example of FIG. 21, the intermediate layer 1202 and portion of the first spacer elements 1602 have been removed. A portion of the first spacer element 1602b remains on the substrate 1102. The first layer 1110 of the dummy gate electrode is exposed.

The method 1000 then proceeds to block 1030 where the first layer of the dummy gate electrode is removed from the substrate. The first layer of the dummy gate electrode may be removed using wet etch and/or a dry etch. In an embodiment, a wet etch process includes exposure to a hydroxide containing solution (e.g., ammonium hydroxide), deionized water, and/or other suitable etchant solutions. Removing the first layer provides a modified profile opening. Referring to the example of FIG. 22, the first layer 1110 has been removed from the substrate 1102 (see FIG. 21). A modified opening 2202 is formed on the substrate 1102. The modified opening 2202 includes a first width w5 which is greater than a second width w6. The difference in the width may be controlled by the thickness of the first spacer element 1106. In an embodiment, the difference between w5 and w6 is between approximately 10 and approximately 60 angstroms.

In an embodiment, the interfacial layer and/or the gate dielectric layer are also removed from the substrate. In such an embodiment, a subsequent interfacial layer and/or gate dielectric layer may be formed. The gate dielectric formed may be a high-k gate dielectric. The high-k material may include metal oxides, metal nitrides, metal silicates, transition metal-oxides, transition metal-nitrides, transition metal-silicates, oxynitrides of metals, metal aluminates, zirconium silicate, zirconium aluminate, combinations thereof, or other suitable compositions. Example high-k dielectrics include hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), combinations thereof, and/or other suitable materials. Alternatively, the high-k dielectric layer may include other high-k dielectrics such as LaO, AlO, ZrO, TiO, $Ta_2O_5$, $Y_2O_3$, $SrTiO_3$ (STO), $BaTiO_3$ (BTO), BaZrO, HfLaO, HfSiO, LaSiO, AlSiO, $(Ba,Sr)TiO_3$ (BST), $Al_2O_3$, $Si_3N_4$, and/or other suitable materials. The high-k dielectric layer may be formed by atomic layer deposition (ALD) and/or other suitable methods.

The method 1000 then proceeds to step 1032 where a metal gate structure is formed in the modified profile opening. The metal gate structure may include a plurality of layers such as, a work function metal, a fill metal, a liner layer, and/or other suitable conductive layers. Example compositions of the metal gate include Ti, TiN, TaN, Ta, TaC, TaSiN, W, WN, MoN, MoON, $RuO_2$, TiAl, and/or other suitable materials. The metal gate structure may include one or more layers formed by PVD, CVD, ALD, plating, and/or other suitable processes. P-type metal materials and/or n-type metal materials may be used. P-type metal materials include compositions such as ruthenium, palladium, platinum, cobalt, nickel, and conductive metal oxides, and/or other suitable materials. N-type metal materials include compositions such as hafnium, zirconium, titanium, tantalum, aluminum, metal carbides (e.g., hafnium carbide, zirconium carbide, titanium carbide, aluminum carbide), aluminides, and/or other suitable materials.

Figure 23:
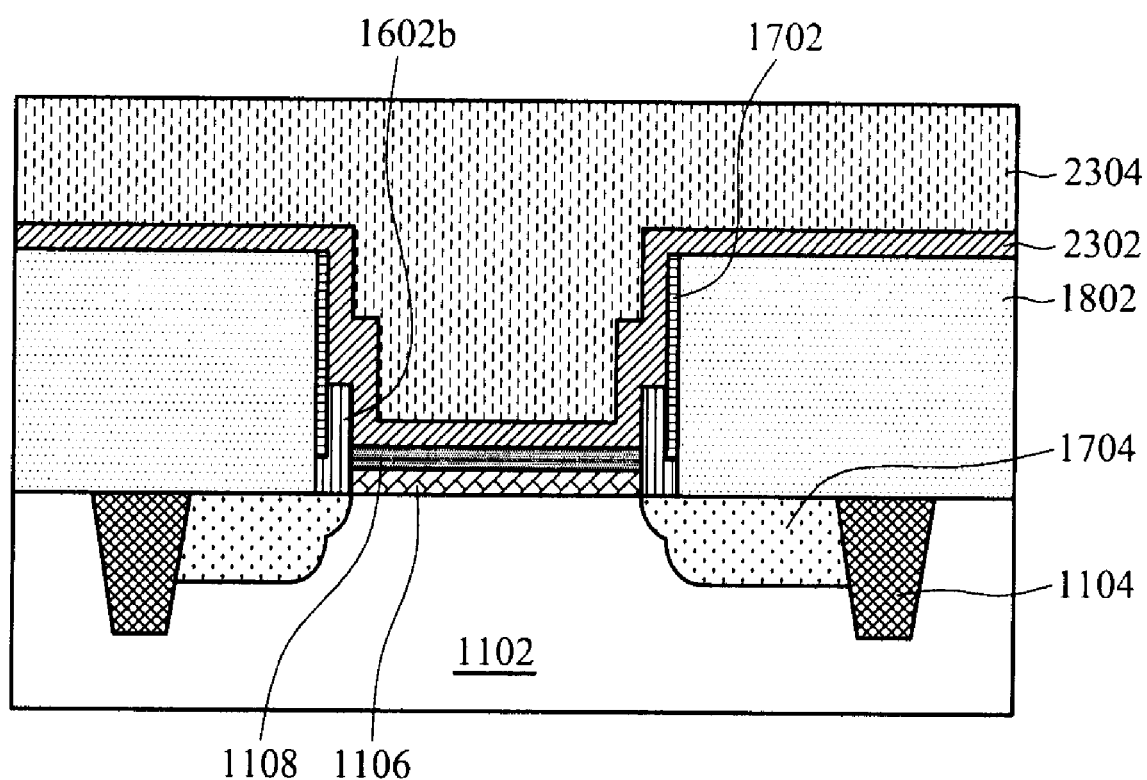

Referring to the example of FIG. 23, a first layer of metal 2302 is formed on the substrate 1102 and in the modified opening 2202. The first layer of metal 2302 may be the work function metal. A second layer of metal 2304 is formed on the substrate 1102 and in the modified opening 2202. The second layer of metal 2304 may be a fill metal. Subsequent processing may include a chemical mechanical polish to planarize the device. Referring to the example of FIG. 24, a device 2400 is illustrated which includes a metal gate electrode 2402. The metal gate electrode 2402 includes the first layer of metal 2302 and the second layer of metal 2304. The metal gate electrode 2402 includes a first width w7 and a second width w8 where w7 is greater than w8. w7 may be the same as or substantially similar to w5 and w8 may be the same as or substantially similar to w6.

The device 2400 may be an intermediate device fabricated during processing of an integrated circuit, or portion thereof, that may comprise memory cells and/or other logic circuits, passive components such as resistors, capacitors, and inductors, and active components such as P-channel field effect transistors (PFET), N-channel FET (NFET), metal-oxide semiconductor field effect transistors (MOSFET), complementary metal-oxide semiconductor (CMOS) transistors, bipolar transistors, high voltage transistors, high frequency transistors, other memory cells, and combinations thereof.

Thus, a plurality of methods is described for forming a replacement gate (e.g., metal gate) in a modified profile opening. Furthermore, one or more devices are illustrated, which include a modified profile gate structure. One or more of the embodiments provides for benefits such as, due to the modified profile opening in which the metal gate is formed, the material (e.g., metal) is more likely to adequately fill the opening. The modified profile opening and/or the resulting modified profile gate structure may allow for a decreased the aspect ratio of the opening to be filled, an increased step-coverage, a decreased overhang produced by the metal fill, a reduction in voiding, an increased process window, a lower gate resistance, and/or various other benefits.

Accordingly, the present disclosure provides a method of forming a replacement gate structure. While the formation has been disclosed as directed to a metal gate last process, a high-k gate dielectric last process, and/or other embodiments, the present disclosure may benefit any semiconductor process now known or developed in the future. While the preceding description shows and describes one or more embodiments, it will be understood by those skilled in the art that various changes in form and detail may be made therein without departing from the spirit and scope of the present disclosure. Therefore, the claims should be interpreted in a broad manner, consistent with the present disclosure.

What is claimed is:

1. A method of fabricating a semiconductor device, comprising:
providing a substrate;
forming a dummy gate structure on the substrate, wherein the dummy gate structure includes a first layer of a dummy gate electrode, an intermediate layer on the first layer and a second layer of the dummy gate electrode on the intermediate layer;
forming a first spacer element abutting the dummy gate structure, wherein the first spacer element and the intermediate layer have substantially the same composition;
forming a modified profile opening on the substrate by removing at least a portion of the dummy gate structure and a portion of the first spacer element, wherein the modified profile opening includes a first width proximate a surface of the substrate and a second width opposing the substrate, the second width being greater than the first width; and
forming a metal gate electrode, wherein the forming the metal gate electrode includes filling the modified profile opening with a conductive material.

2. The method of claim 1, wherein the modified profile opening includes a first portion having arcuate sidewalls.

3. The method of claim 2, wherein the second width is disposed in the first portion.

4. The method of claim 1, wherein the forming the modified profile opening includes:
performing a first etch process, wherein the first etch process removes a portion of the first spacer element and the intermediate layer; and
performing a second etch process, following the first etch process, wherein the second etch process removes the first layer of the dummy gate electrode.

5. The method of claim 4, wherein the first etch process removes a portion of a contact etch stop layer.

6. The method of claim 1, further comprising:
forming a high-k gate dielectric layer in the modified profile opening prior to forming the metal gate electrode.

7. The method of claim 1, further comprising:
forming a second spacer element adjacent the first spacer element, wherein the second spacer element has a different composition that the first spacer element.

8. A method, comprising:
providing a semiconductor substrate;
forming a dummy gate structure on the semiconductor substrate;
forming a spacer element adjacent the dummy gate structure;
forming an etch stop layer on the spacer element;
etching the spacer element and etch stop layer to provide a first opening of a first width prior to removing the dummy gate structure;
thereafter removing the dummy gate structure to provide a second opening of a second width, wherein the second width is less than the first width, and wherein the first and second opening are continual and form a modified profile opening; and
forming a metal gate electrode in the modified profile opening.

9. The method of claim 7, forming a modified profile opening on the substrate by removing the at least a portion of the dummy gate structure and the portion of the first spacer element includes:
performing an etch process, wherein the etch process removes the portion of the first spacer element and the intermediate layer of the dummy gate structure to create a first opening, wherein the first opening is defined by the sidewalls of the second spacer element.

10. The method of claim 1, wherein forming the modified profile opening by removing the at least a portion of the dummy gate structure and the portion of the first spacer element includes:

removing the second layer of the dummy gate electrode;

thereafter, removing the intermediate layer of the dummy gate structure concurrently with removing the portion of the first spacer element; and thereafter, removing the first layer of the dummy gate electrode.

11. The method of claim 1, wherein the intermediate layer is selected from the group consisting of silicon oxide, silicon nitride, silicon oxynitride, silicon carbide, fluoride-doped silicate glass (FSG), a low k dielectric material, and combinations thereof.

12. The method of claim 8, wherein the first opening includes arcuate sidewalls.

13. The method of claim 8, wherein the second opening includes substantially straight sidewalls.

14. The method of claim 8, further comprising:

forming an interlayer dielectric (ILD) layer on the etch stop layer; and prior to etching the spacer element and etch stop layer, removing a portion of the ILD layer such that a top surface of the ILD layer is below a top surface of the dummy gate structure.

15. A method of fabricating a semiconductor device, comprising:

forming a dummy gate structure on the substrate, wherein the dummy gate structure includes a first layer of a dummy gate electrode, an intermediate layer on the first layer and a second layer of the dummy gate electrode on the intermediate layer;

forming a first spacer element abutting the dummy gate structure;

forming a second spacer element adjacent the first spacer element;

forming a modified profile opening on the substrate, wherein the forming the modified opening includes:

performing a first etch process to remove the second layer of the dummy gate electrode;

thereafter, performing a second etch process to remove the intermediate layer and a portion of the first spacer element; and thereafter, performing a third etch process to remove the first layer of the dummy gate electrode; and forming a gate structure in the modified profile opening.

16. The method of fabricating a semiconductor device of claim 15, wherein the removing the intermediate layer and the portion of the first spacer element profile provides an opening defined by a sidewall of the second spacer element.

17. The method of fabricating a semiconductor device of claim 15, wherein the removing the intermediate layer and the portion of the first spacer element profile provides a first portion of the modified profile opening and wherein the removing the first layer of the dummy gate electrode provides a second portion of the modified profile opening, and wherein the first portion has a greater width than the second portion.

18. The method of fabricating a semiconductor device of claim 15, wherein at least one layer of the gate structure directly interfaces the second spacer element.

19. The method of fabricating a semiconductor device of claim 15, wherein the second spacer element includes a material that has an etch selectivity to the second etch process such that the second spacer element is not removed by the second etch process.

20. The method of fabricating a semiconductor device of claim 15, wherein the intermediate layer and the first spacer element are the same dielectric material.

* * * * *